US011510312B2

(12) United States Patent
Lee et al.

(10) Patent No.: US 11,510,312 B2
(45) Date of Patent: Nov. 22, 2022

(54) CIRCUIT BOARD HAVING COPPER CLAD LAMINATE LAMINATED ON CORE LAYER, AND ELECTRONIC DEVICE COMPRISING SAME

(71) Applicant: SAMSUNG ELECTRONICS CO., LTD., Gyeonggi-do (KR)

(72) Inventors: Youngsun Lee, Gyeonggi-do (KR); Eunseok Hong, Gyeonggi-do (KR); Byeongkeol Kim, Gyeonggi-do (KR); Jongmin Jeon, Gyeonggi-do (KR)

(73) Assignee: Samsung Electronics Co., Ltd ( * ) Notice: Subject to any disclaimer, the term of this patent is extended or adjusted under 35 U.S.C. 154(b) by 18 days.

(21) Appl. No.: 17/265,888

(22) PCT Filed: Aug. 1, 2019

(86) PCT No.: PCT/KR2019/009614
§ 371 (c)(1),
(2) Date: Feb. 4, 2021

(87) PCT Pub. No.: WO2020/032478
PCT Pub. Date: Feb. 13, 2020

(65) Prior Publication Data
US 2021/0168934 A1 Jun. 3, 2021

(30) Foreign Application Priority Data

Aug. 7, 2018 (KR) .................. 10-2018-0091960

(51) Int. Cl.
H01Q 1/38 (2006.01)
H05K 1/02 (2006.01)
(Continued)

(52) U.S. Cl.
CPC ............. H05K 1/0277 (2013.01); H01Q 1/48 (2013.01); H01Q 9/0407 (2013.01);
(Continued)

(58) Field of Classification Search
CPC ...... H05K 1/0277; H05K 1/0243; H05K 1/09; H05K 1/115; H05K 1/14; H05K 2201/04;
(Continued)

(56) References Cited

U.S. PATENT DOCUMENTS 8,344,955 B2 * 1/2013 Niemi .................... H01Q 1/085
343/702
2007/0202307 A1 8/2007 Oh et al.
(Continued)

FOREIGN PATENT DOCUMENTS

JP 2013074270 4/2013
KR 1020050033931 4/2005
(Continued)

OTHER PUBLICATIONS

European Search Report dated Aug. 26, 2021 issued in counterpart application No. 19848195.4-1211, 6 pages.
(Continued)

Primary Examiner — Binh B Tran
(74) Attorney, Agent, or Firm — The Farrell Law Firm, P.C.

(57) ABSTRACT

Disclosed are various embodiments related to a circuit board included in an electronic device. According to one embodiment, the circuit board may comprise: a core layer including an upper surface and a lower surface and formed as a substrate made of a prepreg material; a first flexible copper clad laminate including a plurality of conductive layers and laminated on the upper surface; at least one first substrate layer laminated above the first flexible copper clad laminate and including a conductive layer formed on the substrate made of a prepreg material; a second flexible copper clad laminate including a plurality of conductive layers and laminated on the lower surface; and at least one second substrate layer laminated under the second flexible copper (Continued)

clad laminate and including a conductive layer formed on the substrate made of a prepreg material. Various other embodiments are also possible.

8 Claims, 10 Drawing Sheets

(51) Int. Cl.
| | |
|---|---|
| *H01Q 1/48* | (2006.01) |
| *H01Q 9/04* | (2006.01) |
| *H05K 1/09* | (2006.01) |
| *H05K 1/11* | (2006.01) |
| *H05K 1/14* | (2006.01) |

(52) U.S. Cl.
CPC ............. *H05K 1/0243* (2013.01); *H05K 1/09* (2013.01); *H05K 1/115* (2013.01); *H05K 1/14* (2013.01); *H05K 2201/04* (2013.01); *H05K 2201/10098* (2013.01)

(58) Field of Classification Search
CPC ........... H05K 2201/10098; H01Q 1/48; H01K 1/0407
USPC .................................................. 343/700 MS
See application file for complete search history.

(56) References Cited

U.S. PATENT DOCUMENTS

| | | |
|---|---|---|
| 2009/0278752 A1 | 11/2009 | Oh |
| 2011/0094776 A1 | 4/2011 | Lee et al. |
| 2011/0180307 A1* | 7/2011 | Naganuma ........... H05K 3/4691 |
| | | 174/254 |
| 2016/0056091 A1 | 2/2016 | Kim et al. |

FOREIGN PATENT DOCUMENTS

| | | |
|---|---|---|
| KR | 1020090116866 | 11/2009 |
| KR | 1020090116886 | 11/2009 |
| KR | 1020110045991 | 5/2011 |
| KR | 1020130068657 | 6/2013 |
| KR | 1020140020504 | 2/2014 |
| KR | 101466605 | 11/2014 |
| KR | 1020160099934 | 8/2016 |

OTHER PUBLICATIONS

PCT/ISA/210 Search Report issued on PCT/KR2019/009614, dated Nov. 7, 2019, pp. 5.
PCT/ISA/237 Written Opinion issued on PCT/KR2019/009614, dated Nov. 7, 2019, pp. 5.

* cited by examiner

CIRCUIT BOARD HAVING COPPER CLAD LAMINATE LAMINATED ON CORE LAYER, AND ELECTRONIC DEVICE COMPRISING SAME

CROSS-REFERENCE TO RELATED APPLICATION(S)

This application is a National Phase Entry of PCT International Application No. PCT/KR2019/009614, which was filed on Aug. 1, 2019, and claims priority to Korean Patent Application No. 10-2018-0091960, which was filed on Aug. 7, 2018 in the Korean Intellectual Property Office, the contents of each of which are incorporated herein by reference.

BACKGROUND

1. Field

Various embodiments of the disclosure relate to a circuit board and an electronic device including the circuit board.

2. Description of the Related Art

Electronic devices may output information stored therein as sound or an image. As the degree of integration of electronic devices has increased and super-high-speed and large-capacity RF communication has become popular, multiple functions have recently come to be provided in a single electronic device, such as a mobile communication terminal. For example, various functions, such as an entertainment function (e.g., a game function), a multimedia function (e.g., a music/video reproduction function), a communication and security function (e.g., mobile banking), a schedule management function, and an e-wallet function, are integrated in a single electronic device, in addition to a communication function.

Recently, as miniaturization, slimming, and high density of electronic devices have been emphasized, integration and thinning of circuit boards included in electronic devices have been demanded. The circuit boards may include rigid circuit boards and flexible circuit boards according to physical characteristics related to the flexibility thereof.

SUMMARY

In a multilayer rigid-flexible circuit board, with reference to a flexible circuit board, a plurality of substrates including circuit layers and insulating layers may be disposed above the rigid circuit board through lamination and a plurality of substrates including relatively fewer circuit layers and insulating layers than the substrates disposed above the rigid circuit board may be disposed below the rigid circuit board through lamination. For example, seven substrate layers may be disposed above the rigid circuit board through a seven-step process, and five substrate layers may be disposed below the rigid circuit board through a five-step process. In this case, the substrate layers disposed above and below the rigid circuit board are unbalanced, and due to this, a signal loss may increase due to a change in impedance of high-speed wiring signal lines (e.g., signal lines and RF signal lines) in the multilayer rigid-flexible circuit board area. In addition, when the number of laminated substrate layers increases in the multilayer rigid-flexible circuit board, the manufacturing cost and manufacturing time of a product may increase.

An embodiment of the disclosure is capable of providing an electronic device including a circuit board, which enables a signal loss caused due to a change in impedance of high-speed wiring signal lines (e.g., signal lines or RF signal lines) in a circuit board area to be reduced by disposing substrate layers above and below the core layer of the circuit board in a balanced manner.

According to various embodiments of the disclosure, a circuit board may include: a core layer including a top surface and a bottom surface, and formed of a prepreg substrate; a first flexible copper clad laminate including a plurality of conductive layers and laminated on the top surface; at least one first substrate layer laminated above the first flexible copper clad laminate, and including a conductive layer formed on the prepreg substrate; a second flexible copper clad laminate including a plurality of conductive layers and laminated on the bottom surface; and at least one second substrate layer laminated below the second flexible copper clad laminate, and including a plurality of conductive layers formed in the prepreg substrate.

According to various embodiments of the disclosure, a circuit board may include: a core layer including a top surface and a bottom surface, and formed of a hard substrate; a first flexible copper clad laminate including a plurality of conductive layers and laminated on the top surface; and a second flexible copper clad laminate including a plurality of conductive layers and laminated on the bottom surface.

According to an embodiment of the disclosure, an electronic device may include: a first rigid circuit board including: a core layer including a top surface and a bottom surface; at least one first substrate layer disposed above the top surface of the core layer; and at least one second substrate layer disposed below the bottom surface of the core layer, wherein a first flexible copper clad laminate is disposed between the core layer and the at least one first substrate layer and a second flexible copper clad laminate is disposed between the core layer and the at least one second substrate layer; a second rigid circuit board disposed on at least a portion of the second flexible copper clad laminate and electrically connected to the first rigid circuit board using the plurality of conductive layers of the second flexible copper clad laminate; and a flexible circuit board extending from at least a portion of the second flexible copper clad laminate and exposed between the first and second rigid circuit boards such that at least a portion of the flexible circuit board is bent.

According to various embodiments of the disclosure, an electronic device may include: a first rigid circuit board including: a first core layer including a top surface and a bottom surface; at least one first substrate layer disposed above the top surface of the first core layer; and at least one second substrate layer disposed below the bottom surface of the first core layer, wherein a first flexible copper clad laminate is disposed between the first core layer and the at least one first substrate layer and a second flexible copper clad laminate is disposed between the first core layer and the at least one second substrate layer; a second rigid circuit board including: a second core layer disposed on at least a portion of the first and second flexible copper clad laminates and including a top surface and a bottom surface; at least one third substrate layer disposed above the top surface of the second core layer; and at least one fourth substrate layer disposed below the bottom surface of the second core layer, wherein a third flexible copper clad laminate is disposed between the second core layer and the at least one third substrate layer at least one and a fourth flexible copper clad laminate is disposed between the second core layer and the at least one fourth substrate layer; and first and second flexible circuit boards extending from at least a portion of the first and second flexible copper clad laminates and exposed between the first and second rigid circuit boards such that at least a portion of the first and second flexible circuit boards is bent.

According to at least one of the above-described solutions to problems of the disclosure, with reference to a core layer on the circuit board according to an embodiment of the disclosure, by evenly disposing the first and second flexible copper clad laminates and at least one first and second substrate layer symmetrical to each other above and below the core layer, even when high-speed signal lines (e.g., signal lines and RF signal lines) are laid on the circuit board, it is possible to reduce a signal loss caused due to a change in impedance of the high-speed wiring signal lines in the circuit board area and to achieve signal integrity and stabilization of radio frequency interference (RFI). In other words, in the past, since seven substrate layers are disposed above the core layer and five substrate layers are disposed below the core layer, and thus substrate layers are unevenly disposed above and below the core layer, the signal loss increases in the signal lines and the RF signal lines of the circuit board and manufacturing steps and a manufacturing time increase. However, in the circuit board according to an embodiment of the disclosure, by evenly disposing substrate layers such that five substrate layers are disposed above the core layer and five substrate layers are disposed below the core layer, it is possible to reduce the signal loss in signal lines and RF signal lines of a product. Furthermore, due to the reduction of the number of laminated substrate layers, it is possible to reduce the manufacturing steps and time of the product, and it is also possible to reduce the manufacturing costs of the product.

According to an embodiment, with respect to the core layer of a circuit board between the first and second rigid circuit boards, by symmetrically disposing first and second flexible circuit boards above and below the core layer, it is possible to implement bending using the first and second flexible circuit boards between the first and second rigid circuit boards and to stably maintain the bent state. Similarly, it is also possible to reduce the signal loss caused due to a change in impedance in the high-speed wiring signal lines (e.g., a signal line and an RF signal line in the area of the first and second flexible circuit boards).

DETAILED DESCRIPTION

Figure 1:
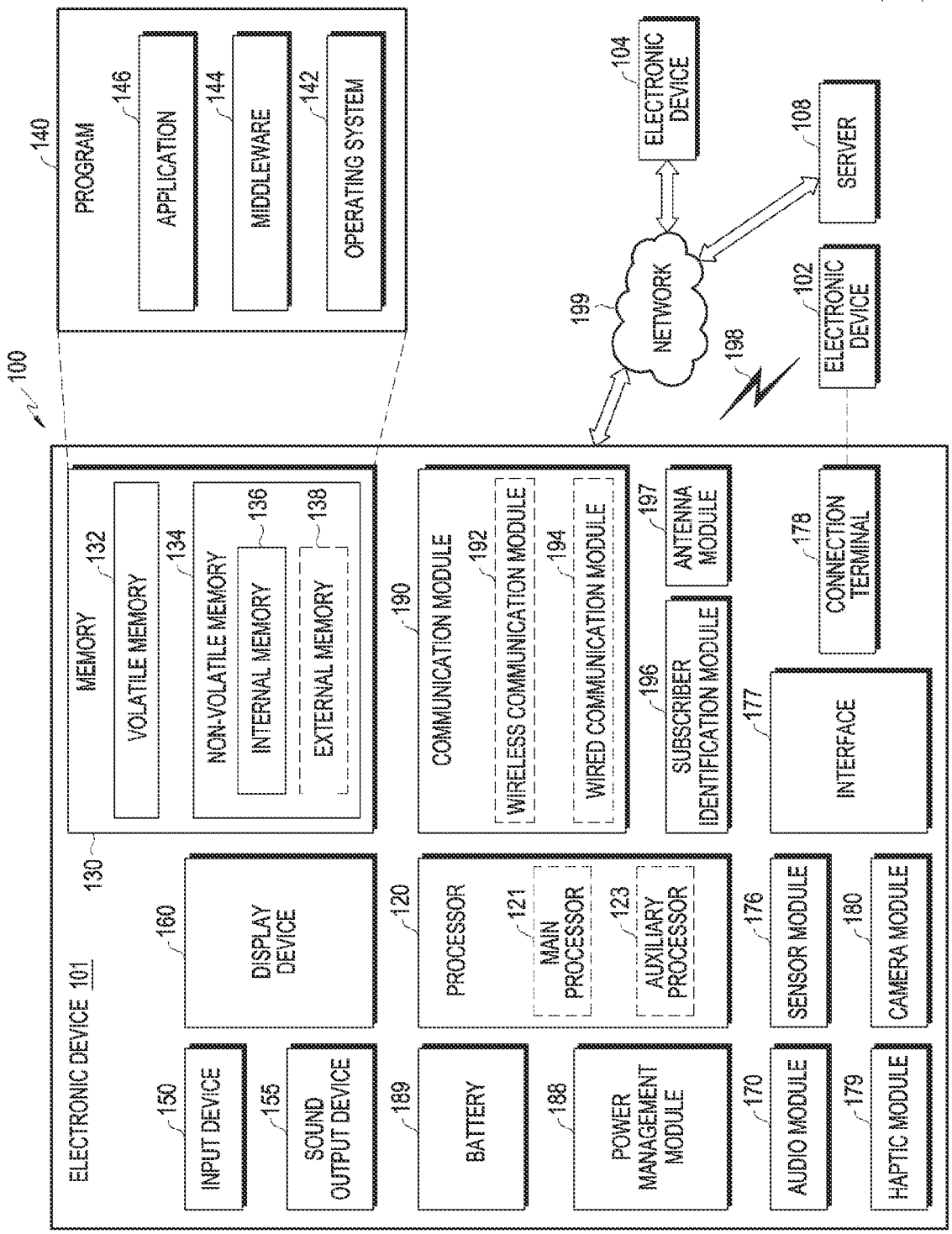
FIG. 1 is a block diagram illustrating an electronic device in a network environment according to various embodiments.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by a component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image and moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and support a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and at least one antenna appropriate for a communication scheme used in the communication network, such as the first network 198 or the second network 199, may be selected, for example, by the communication module 190 from the one or more antennas. The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPM), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., a program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
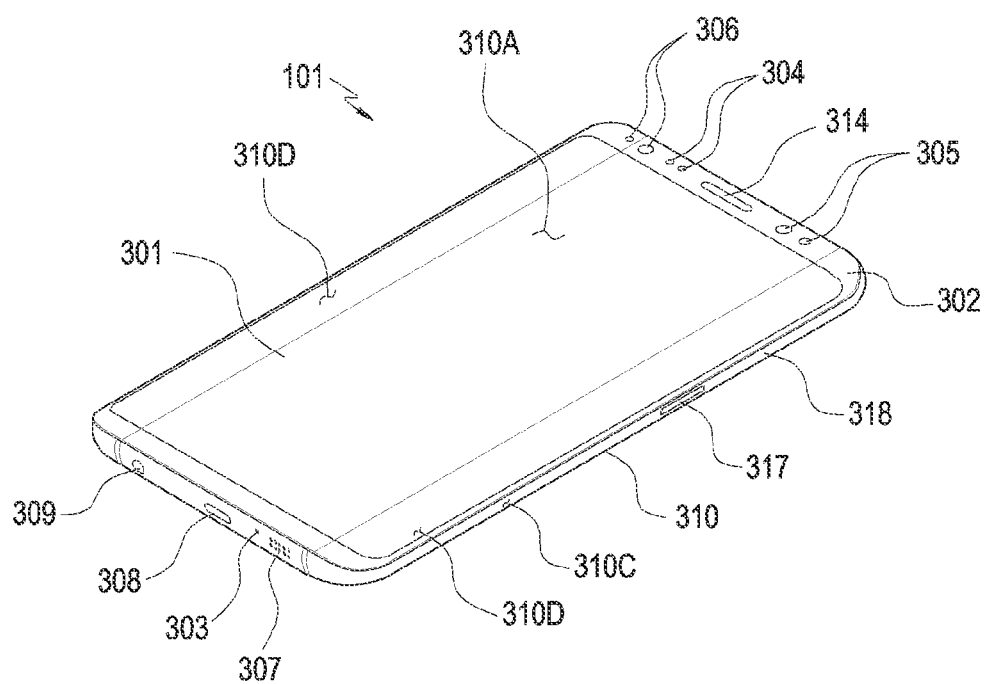
FIG. 2 is a front side perspective view illustrating an electronic device according to various embodiments of the disclosure.
Figure 3:
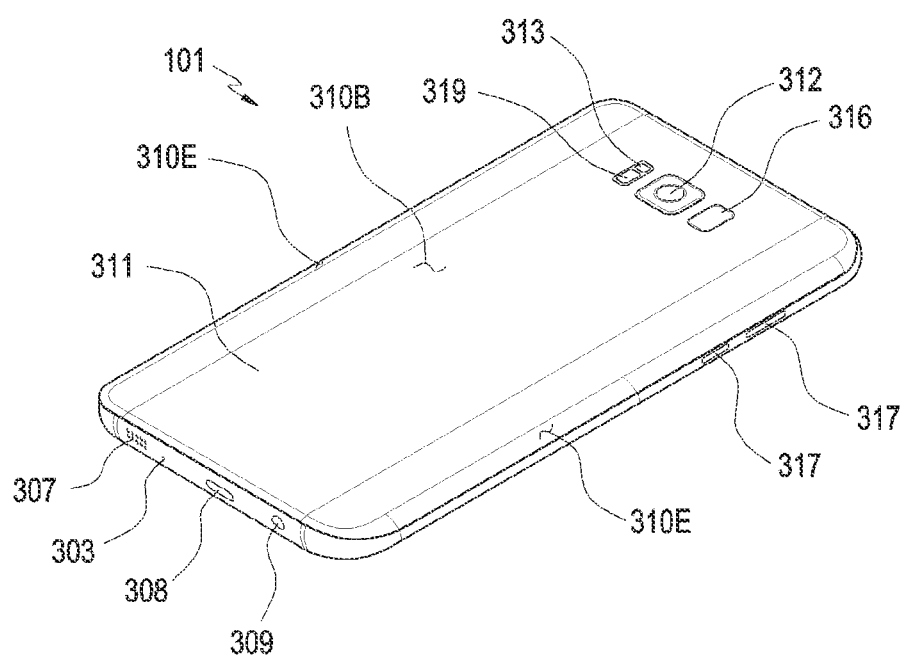
FIG. 3 is a rear side perspective view illustrating the electronic device according to various embodiments of the disclosure.

FIG. 2 is a front side perspective view illustrating an electronic device 101 according to various embodiments of the disclosure. FIG. 3 is a rear side perspective view illustrating the electronic device 101 according to various embodiments of the disclosure.

Referring to FIGS. 2 and 3, the electronic device 101 according to an embodiment may include a housing 310 including a first surface (or a front surface) 310A, a second surface (or a rear surface) 310B, and a side surface 310C surrounding the space between the first surface 310A and the second surface 310B. In another embodiment (not illustrated), the term "housing" may refer to a structure forming some of the first surface 310A, the second surface 310B, and the side surface 310C of FIG. 2. According to an embodiment, at least a portion of the first surface 310A may be defined by a substantially transparent front plate 302 (e.g., a glass plate or a polymer plate including various coating layers). The second surface 310B may be defined by a substantially opaque rear plate 311. The rear plate 311 may be made of, for example, coated or colored glass, ceramic, a polymer, a metal (e.g., aluminum, stainless steel (STS), or magnesium), or a combination of two or more of these materials. The side surface 310C may be defined by a side bezel structure 318 (or a "side member") coupled to the front plate 302 and the rear plate 311 and including a metal and/or a polymer. In some embodiments, the rear plate 311 and the side bezel structure 318 may be integrally formed, and may include the same material (e.g., a metal material such as aluminum).

In the illustrated embodiment, the front plate 302 may include, at the long opposite side edges thereof, two first areas 310D, which are bent from the first surface 310A towards the rear plate 311 and extend seamlessly. In the illustrated embodiment (see FIG. 3), the rear plate 311 may include, at the long opposite side edges thereof, two second areas 310E, which are bent from the second surface 310B towards the front plate 302 and extend seamlessly. In some embodiments, the front plate 302 (or the rear plate 311) may include only one of the first areas 310D (or the second areas 310E). In another embodiment, some of the first areas 310D and the second areas 310E may not be included. In the embodiments described above, when viewed from the side of the electronic device 101, the side bezel structure 318 may have a first thickness (or width) on the side surface portions that do not include the first areas 310D or the second areas 310E, and may have a second thickness, which is smaller than the first thickness, on the side surface portions that include the first areas 310D or the second areas 310E.

According to an embodiment, the electronic device 101 may include at least one of a display 301, audio modules 303, 307, and 314, sensor modules 304, 316, and 319, camera modules 305, 312, and 313, key input devices 317, light-emitting elements 306, and connector holes 308 and 309. In some embodiments, at least one of the components (e.g., the key input devices 317 or the light-emitting elements 306) may be omitted from the electronic device 101, or other components may be additionally included in the electronic device 101.

The display 301 may be exposed through a substantial portion of, for example, the front plate 302. In some embodiments, at least a portion of the display 301 may be exposed through the front plate 302 defining the first surface 310A and the first areas 310D of the side surface 310C. In some embodiments, the edges of the display 301 may be formed to be substantially the same as the shape of the periphery of the front plate 302 adjacent thereto. In another embodiment (not illustrated), the distance between the periphery of the display 301 and the periphery of the front plate 302 may be substantially constant in order to enlarge the exposed area of the display 301.

In another embodiment (not illustrated), recesses or openings may be formed in some portions of the screen display area of the display 301, and one or more of the audio module 314, the sensor module 304, the camera module 305, and the light-emitting elements 306 may be aligned with the recesses or the openings. In another embodiment (not illustrated), the rear surface of the screen display area of the display 301 may include at least one of the audio modules 314, the sensor modules 304, the camera modules 305, the fingerprint sensor 316, and the light-emitting elements 306. In another embodiment (not illustrated), the display 301 may be coupled to or disposed adjacent to a touch-sensitive circuit, a pressure sensor capable of measuring a touch intensity (pressure), and/or a digitizer configured to detect a magnetic-field-type stylus pen. In some embodiments, at least some of the sensor modules 304 and 519 and/or at least some of the key input devices 317 may be disposed in the first areas 310D and/or the second areas 310E.

The audio modules 303, 307, and 314 may include a microphone hole 303 and speaker holes 307 and 314. The microphone hole 303 may include a microphone disposed therein so as to acquire external sound, and in some embodiments, multiple microphones may be disposed therein so as to enable detection of the direction of sound. The speaker holes 307 and 314 may include an external speaker hole 307 and a phone call receiver hole 314. In some embodiments, the speaker holes 307 and 314 and the microphone hole 303 may be implemented as a single hole, or a speaker may be included therein without the speaker holes 307 and 314 (e.g., a piezo speaker).

The sensor modules 304, 316, and 319 may generate electrical signals or data values corresponding to the internal operating state or the external environmental state of the electronic device 101. The sensor modules 304, 316, and 319 may include, for example, a first sensor module 304 (e.g., a proximity sensor) and/or a second sensor module (not illustrated) (e.g., a fingerprint sensor) disposed on the first surface 310A of the housing 310, and/or a third sensor module 319 (e.g., an HRM sensor), and/or a fourth sensor module 316 (e.g., a fingerprint sensor) disposed on the second surface 310B of the housing 310. The fingerprint sensor may be disposed not only on the first surface 310A of the housing 310 (e.g., the display 301), but also on the second surface 310B. The electronic device 101 may further include at least one of sensor modules (not illustrated) such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 305, 312, and 313 may include a first camera device 305 disposed on the first surface 310A of the electronic device 101 and a second camera device 312 disposed on the second surface 310B thereof, and/or a flash 313. The camera modules 305 and 312 may include one or more lenses, an image sensor, and/or an image signal processor. The flash 313 may include, for example, a light-emitting diode or a xenon lamp. In some embodiments, two or more lenses (e.g., an infrared camera lens, a wide-angle lens, and a telephoto lens) and image sensors may be disposed on one surface of the electronic device 101.

The key input devices 317 may be disposed on the side surface 310C of the housing 310. In another embodiment, the electronic device 101 may not include some or all of the above-mentioned key input devices 317, and a key input device 317, which is not included in the electronic device 101, may be implemented in another form, such as a soft key, on the display 301. In some embodiments, the key input devices may include a sensor module 316 disposed on the second surface 310B of the housing 310.

The light-emitting element 306 may be disposed, for example, on the first surface 310A of the housing 310. The light-emitting elements 306 may provide, for example, information about the state of the electronic device 101 in an optical form. In another embodiment, the light-emitting element 306 may provide a light source that is interlocked with, for example, the operation of the camera module 305. The light-emitting elements 306 may include, for example, an LED, an IR LED, and a xenon lamp.

The connector holes 308 and 309 may include a first connector hole 308, which is capable of accommodating a connector (e.g., a USB connector) for transmitting and receiving power and/or data to and from an external electronic device, and/or a second connector hole 309, which is capable of receiving a connector (e.g., an earphone jack) for transmitting and receiving an audio signal to and from an external electronic device.

Figure 4:
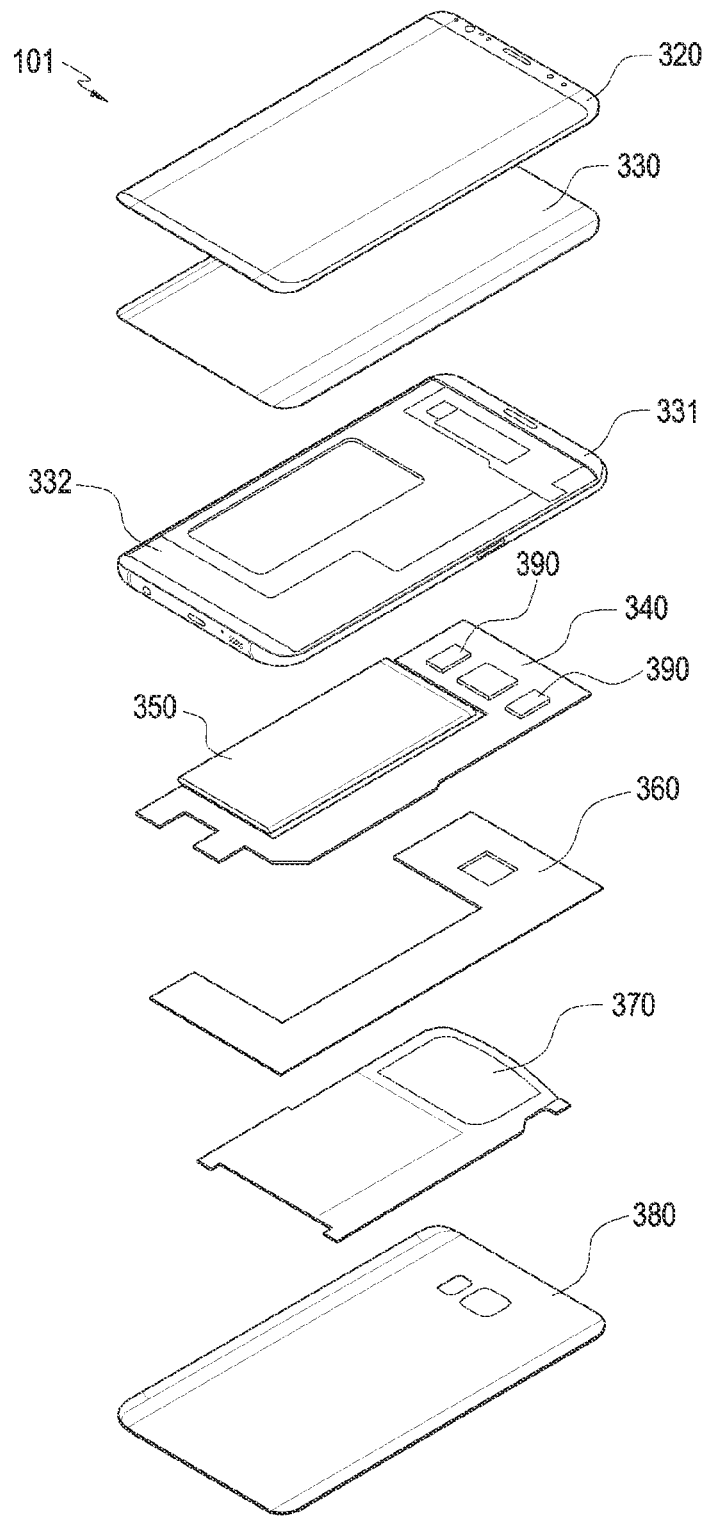
FIG. 4 is an exploded perspective view illustrating an electronic device according to various embodiments of the disclosure.

FIG. 4 is an exploded perspective view illustrating an electronic device 101 according to various embodiments.

Referring to FIG. 4, an electronic device 101 (e.g., the electronic device 101 in FIGS. 1 to 3) may include a side bezel structure 331, a first support member 332 (e.g., a bracket), a front plate 320, a display 330, a printed circuit board 340, a battery 350, a second support member 360 (e.g., a rear case), an antenna 370, and a rear plate 380. In some embodiments, at least one of the components (e.g., the first support member 332 or the second support member 360) may be omitted from the electronic device 101, or other components may be additionally included in the electronic device 101. At least one of the components of the electronic device 101 may be the same as or similar to at least one of the components of the electronic device 101 of FIG. 2 or 3, and a redundant description thereof is omitted below.

The first support member 332 may be disposed inside the electronic device 101 so as to be connected to the side bezel structure 331, or may be formed integrally with the side bezel structure 331. The first support member 332 may be formed of, for example, a metal material and/or a non-metal material (e.g., a polymer). The display 330 may be coupled to one surface of the first support member 332, and the printed circuit board 340 may be coupled to the other surface of the first support member 311. On the printed circuit board 340, a processor, a memory, and/or an interface may be mounted. The processor may include at least one of, for example, a central processing unit, an application processor, a graphics processor, an image signal processor, a sensor hub processor, or a communication processor.

The memory may include, for example, a volatile memory or a nonvolatile memory.

The interface may include, for example, a high-definition multimedia interface (HDMI), a universal serial bus (USB) interface, an SD card interface, and/or an audio interface. The interface may electrically or physically connect, for example, the electronic device 101 to an external electronic device, and may include a USB connector, an SD card/MMC connector, or an audio connector.

The battery 350 is a device for supplying power to at least one component of the electronic device 101, and may include, for example, a non-rechargeable primary battery, a rechargeable secondary battery, or a fuel cell. At least a portion of the battery 350 may be disposed on substantially the same plane as, for example, the printed circuit board 340. The battery 350 may be integrally disposed inside the electronic device 101, or may be detachably disposed on the electronic device 101.

The antenna 370 may be disposed between the rear plate 380 and the battery 350. The antenna 370 may include, for example, a nearfield communication (NFC) antenna, a wireless charging antenna, and/or a magnetic secure transmission (MST) antenna. The antenna 370 may perform short-range communication with, for example, an external electronic device, or may transmit/receive power required for charging to/from the external device in a wireless manner. In another embodiment, an antenna structure may be formed by the side bezel structure 331, a portion of the first support member 332, or a combination thereof.

According to various embodiments, an electronic device may include multiple communication devices 390. For example, some of the multiple communication devices 390 may be implemented in order to transmit and receive radio waves having different characteristics (provisionally referred to as radio waves of A and B frequency bands) for MIMO implementation. As another example, some of the multiple communication devices 390 may be configured, for example, to simultaneously transmit and receive radio waves having the same characteristics (provisionally referred to as radio waves having A1 and A2 frequencies in the A frequency band) for diversity implementation. As another example, the remaining ones of the multiple communication devices 390 may be configured, for example, to simultaneously transmit and receive radio waves having the same characteristics (provisionally referred to as radio waves having B1 and B2 frequencies in the B frequency band) for diversity implementation. In an embodiment of the disclosure, the electronic device 101 may include two communication devices, but, in another embodiment of the disclosure, the electronic device 101 may include four communication devices so as to simultaneously implement MIMO and diversity. In another embodiment, the electronic device 101 may include only one communication device 390.

According to an embodiment, in consideration of the transmission/reception characteristics of radio waves, when one communication device is disposed at a first position on the printed circuit board 340, another communication device may be disposed at a second position, which is separated from the first position on the printed circuit board 340. As another example, one communication device and another communication device may be arranged in consideration of the mutual separation distance between the one communication device and the other communication device according to a diversity characteristic.

According to an embodiment, at least one communication device 390 may include an RF communication circuit that processes radio waves transmitted/received in a ultra-high-frequency band (e.g., 6 GHz or higher and 300 GHz or lower). The radiation conductors of the at least one communication device 390 may include, for example, a patch-type radiation conductor or a radiation conductor having a dipole structure extending in one direction, and multiple radiation conductors may be arrayed to form an antenna array. For example, a chip in which some of the RF communication circuits are implemented (e.g., an integrated circuit chip) may be disposed on one side of the area in which the radiation conductor is disposed or on the surface that faces away from the surface on which the radiation conductor is disposed, and may be electrically connected to the radiation conductor(s) through wiring made of a printed circuit pattern.

Figure 5:
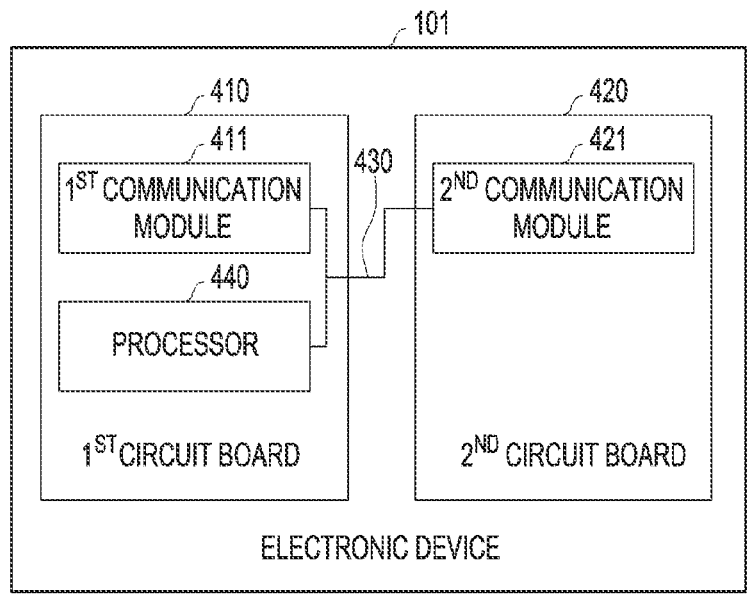
FIG. 5 is a view illustrating an exemplary electronic device that supports various kinds of communication.

FIG. 5 is a view illustrating an example of an electronic device 101 that supports various communication.

Referring to FIG. 5, the electronic device 101 may include a processor 440 (e.g., the processor 120 in FIG. 1), a first communication module 411, a second communication module 421, or a conductive line 430.

According to an embodiment, the electronic device 101 may include at least one communication module. For example, the electronic device 101 may include at least one of a first communication module 411 disposed on a first circuit board 410 and a second communication module 421 disposed on a second circuit board 420.

According to an embodiment, the first communication module 411 and the second communication module 421 may be located inside the electronic device 101. According to an embodiment, when viewed from above the rear plate of the electronic device, the first communication module 411 or the second communication module 421 may be located at the upper-left end of the electronic device 101, at the upper-right end of the electronic device 101, at the lower-left end of the electronic device 101, or at the lower-right end of the electronic device 101.

According to an embodiment, the processor 440 may be disposed on the first circuit board 410, and may include one or more of a central processing unit, an application processor, a graphic processing unit (GPU), a camera image signal processor, or a baseband processor (or a communication processor (CP)). According to an embodiment, the processor 440 may be implemented as a system-on-chip (SoC) or a system-in package (SiP).

According to an embodiment, the first communication module 411 may be electrically connected to the second communication module 421 using at least one conductive line. The first communication module 411 or the second communication module 421 may include, for example, a baseband processor, or at least one communication circuit (e.g., an IFIC or an RFIC). The first communication module 411 or the second communication module 421 may be electrically connected to, for example, a baseband processor separate from the processor 440 (e.g., an application processor (AP)). The conductive line 430 may include, for example, a coaxial cable or an FPCB.

According to an embodiment, the first communication module 411 or the second communication module 421 may include a first baseband processor (BP) (not illustrated) or a second baseband processor (BP) (not illustrated). The electronic device 101 may further include one or more interfaces for supporting chip-to-chip communication between the first BP (or the second BP) and the processor 440. The processor 440 and the first BP or the second BP may transmit and receive data using an inter-chip interface (inter-process communication channel).

According to an embodiment, the first BP or the second BP may provide an interface for performing communication with other entities. The first BP may support, for example, RF communication for a first network (not illustrated). The second BP may support, for example, RF communication for a second network (not illustrated).

According to an embodiment, the first BP or the second BP may form one module with the processor 440. For example, the first BP or the second BP may be integrally formed with the processor 440. As another example, the first BP or the second BP may be disposed in one chip, or may be formed in the form of an independent chip. According to an embodiment, the processor 440 and at least one BP (e.g., the first BP) may be integrally formed in one chip (an SoC chip), and the other BP (e.g., the second BP) may be formed in the form of an independent chip.

According to an embodiment, the first network (not illustrated) or the second network (not illustrated) may correspond to the network 199 of FIG. 1. According to an embodiment, each of the first network (not illustrated) and the second network (not illustrated) may include a 4th generation (4G) network and a 5th generation (5G) network. The 4G network may support, for example, a long-term evolution (LTE) protocol defined in the 3GPP. The 5G network may support, for example, the new radio (NR) protocol defined in the 3GPP.

Figure 6:
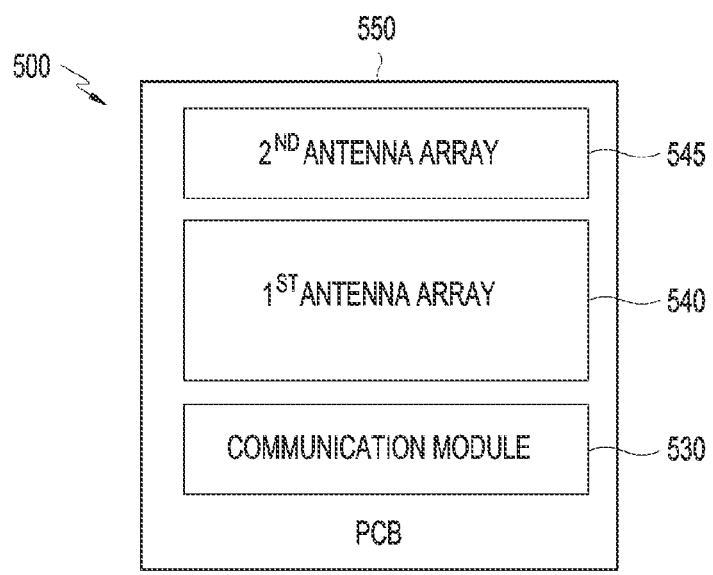
FIG. 6 is a block diagram of a second circuit board of FIG. 5.

FIG. 6 is a block diagram of a second circuit board of FIG. 5.

Referring to FIG. 6, on a second circuit board 550, a communication module 530 (e.g., the second communication module 421 in FIG. 5) (e.g., an RFIC), a first antenna array 540, or a second antenna array 545 may be mounted.

According to an embodiment, on the PCB 550, a communication module 530, a first antenna array 540, or a second antenna array 545 may be disposed. For example, the first antenna array 540 or the second antenna array 545 may be disposed on a first surface of the PCB 550, and the communication module 530 may be disposed on the second surface of the PCB 550. The PCB 550 may include a connector (e.g., a coaxial cable connector or a board to board (B-to-B) connector) to be electrically connected to another PCB (e.g., the first circuit board 410 on which the first communication module 411 of FIG. 5 is disposed) using a transmission line (e.g., the conductive line 430 in FIG. 5 or a coaxial cable). The PCB 550 may be connected to a PCB on which a communication module (e.g., the first communication module 411 in FIG. 5) is disposed using, for example, a coaxial cable connector, and the coaxial cable may be used for delivering transmission and reception IF signals or RF signals. As another example, power or other control signals may be transferred through the B-to-B connector.

According to an embodiment, the first antenna array 540 or the second antenna array 545 may include multiple antennas. The antennas may include a patch antenna, a loop antenna, or a dipole antenna. For example, the multiple antennas included in the first antenna array 540 may be patch antennas in order to form a beam toward the rear plate of the electronic device 101. As another example, the multiple antennas included in the second antenna array 545 may be a dipole antenna or a loop antenna in order to form a beam toward the side member of the electronic device 101.

According to an embodiment, the communication module 530 may support at least a part of a band from about 6 GHz to 300 GHz (e.g., from about 24 GHz to about 30 GHz or from 37 GHz to 40 GHz). According to an embodiment, the communication module 530 may upconvert or downconvert a frequency. For example, the communication module 530 included in the electronic device 101 may upconvert an intermediate frequency (IF) signal received through a conductive line (e.g., the conductive line 430 in FIG. 5) into a radio frequency (RF) signal. As another example, the communication module 530 included in the electronic device 101 may downconvert an RF signal (e.g., a mm wave signal) received via the first antenna array 540 or the second antenna array 545 into an IF signal, and may transmit the IF signal to another communication module (e.g., 421 in FIG. 5) using a conductive line.

Figure 7A:
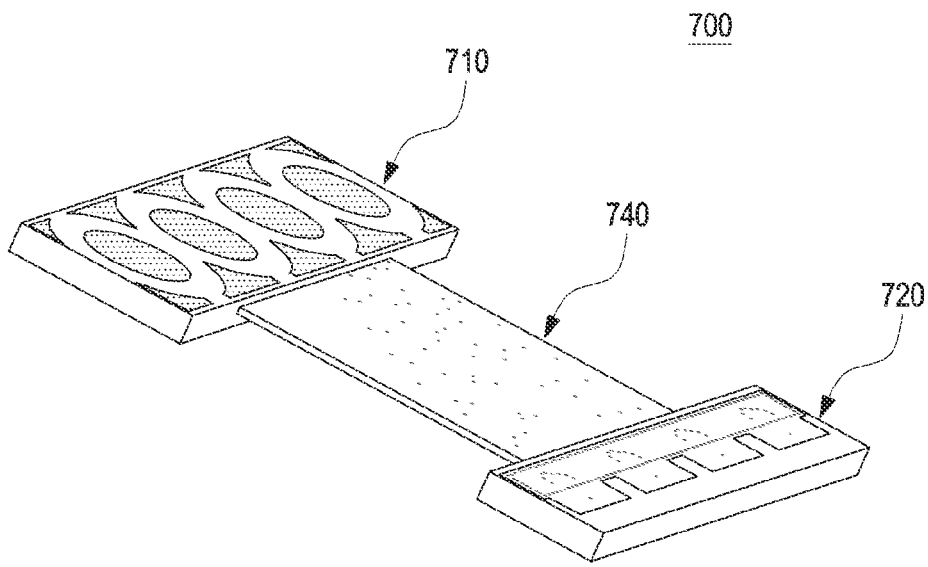
FIG. 7A is a perspective view illustrating first and second rigid circuit boards and a flexible circuit board in the configuration of a circuit board according to various embodiments of the disclosure in an assembled state.
Figure 7B:
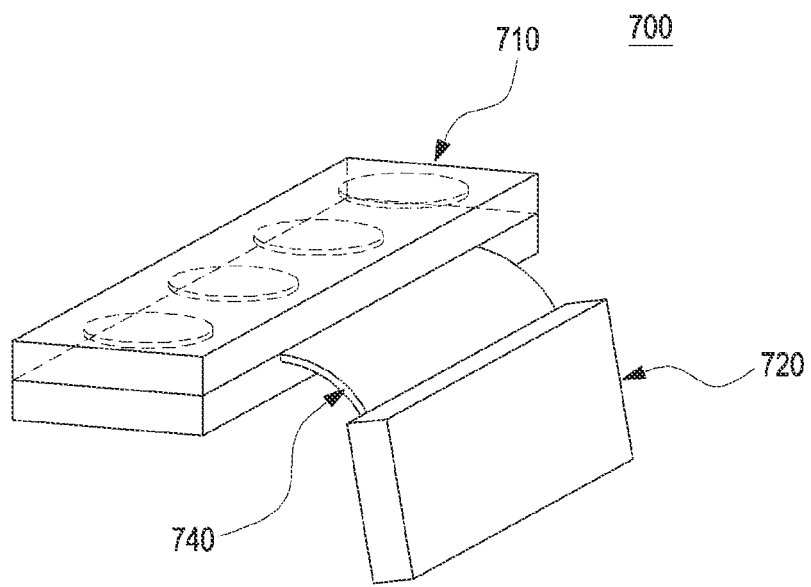
FIG. 7B is a perspective view illustrating of first and second rigid circuit boards and a flexible circuit board, which is bent, in the configuration of a circuit board according to various embodiments of the disclosure in an assembled state.
Figure 8:
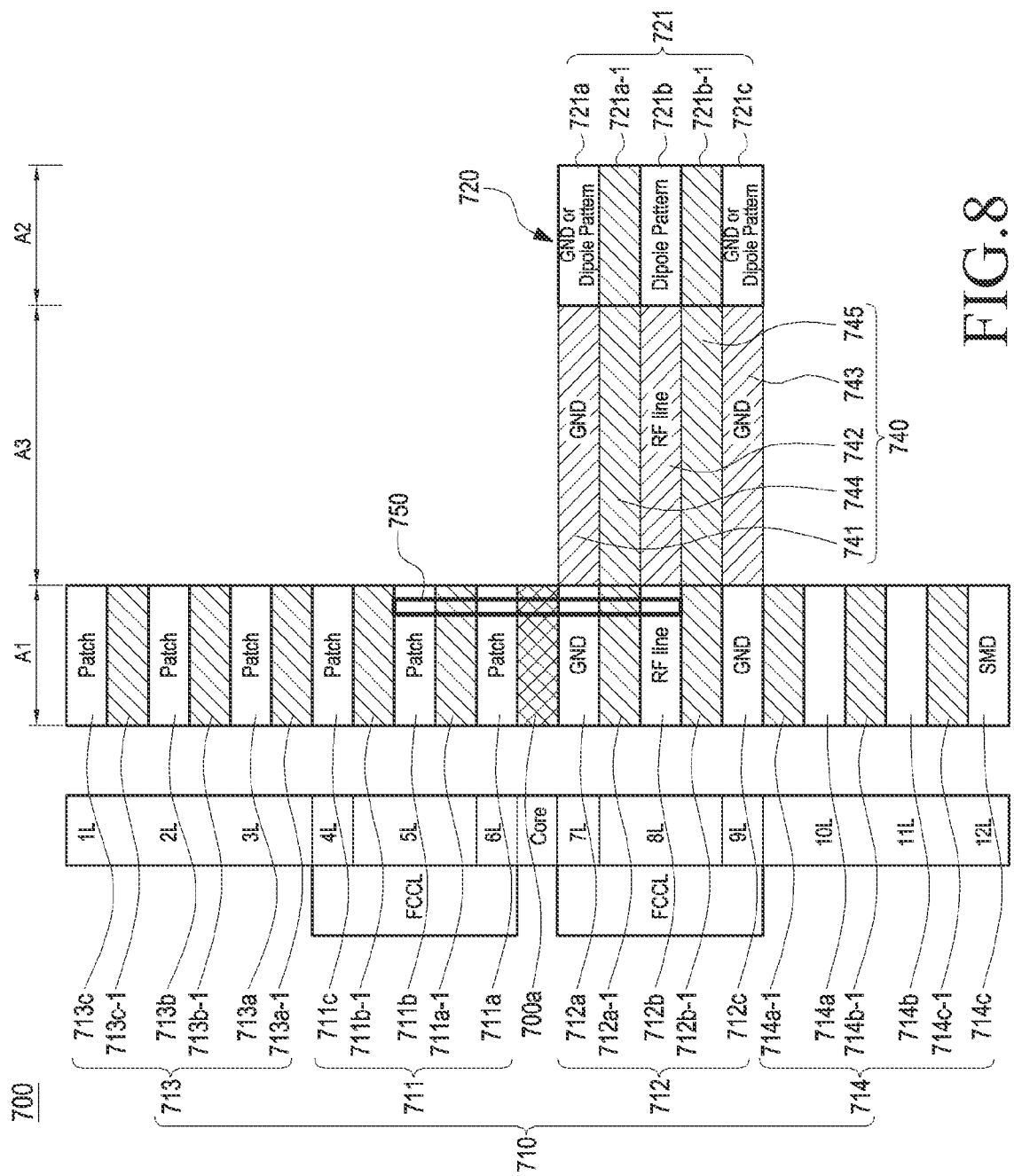
FIG. 8 is a view briefly illustrating a first rigid circuit board and a flexible circuit board, which is bent, in the configuration of a circuit board according to various embodiments of the disclosure in an assembled state.

FIG. 7A is a perspective view illustrating first and second rigid circuit boards and a flexible circuit board in the configuration of a circuit board according to various embodiments of the disclosure in an assembled state, FIG. 7B is a perspective view illustrating first and second rigid circuit boards and a flexible circuit board, which is bent, in the configuration of a circuit board according to various embodiments of the disclosure in an assembled state, and FIG. 8 is a view briefly illustrating a first rigid circuit board and a flexible circuit board, which is bent, in the configuration of a circuit board according to various embodiments of the disclosure in an assembled state.

Referring to FIGS. 7A, 7B, and 8, a circuit board 700 according to various embodiments may include a rigid-flexible circuit board, and the rigid-flexible circuit board 700 may include first and second rigid circuit boards 710 and 720 and a flexible circuit board 740 disposed between the first and second rigid circuit boards 710 and 720. For example, the first rigid circuit board 710 may be disposed in a first area A1 of the rigid-flexible circuit board 700, the flexible circuit board 740 may be disposed in a third area A3 of the rigid-flexible circuit board 700, and the second rigid circuit board 720 may be disposed in a second area A2 of the rigid-flexible circuit board 700. The flexible circuit board 740 may be disposed on and extend from at least a portion of a second flexible copper clad laminate 712 to be described later, and may be exposed between the first and second rigid circuit boards 710 and 720 to at least partially bent.

According to various embodiments, the rigid-flexible circuit board 700 may have a multilayer structure, the first rigid circuit board 710 may include a core layer 700*a* including a top surface and a bottom surface and may include a first flexible copper clad laminate 711 laminated on the top surface of the core layer 700*a*, a second flexible copper clad laminate 712 laminated on the bottom surface of the core layer 700*a*, at least one first substrate layer 713 laminated on the top surface of the first flexible copper clad laminate 711, and at least one second substrate layer 714 laminated on the bottom surface of the second flexible copper clad laminate 712.

According to various embodiments, the first flexible copper clad laminate 711 of the first rigid circuit board 710 may include a plurality of conductive layers and a plurality of insulating layers. The plurality of conductive layers may include first, second, and third conductive layers 711*a*, 711*b*, and 711*c*, and the plurality of insulating layers may include first and second insulating layers 711*a*-1 and 711*b*-1. For example, the first conductive layer 711*a* may be disposed to be in contact with the top surface of the core layer 700*a*, and the first insulating layer 711*a*-1 may be disposed to be in contact with the top surface of the first conductive layer 711*a*. The second conductive layer 711*b* including a first antenna (e.g., a patch antenna) may be disposed to be in contact with the top surface of the first insulating layer 711*a*-1, the second insulating layer 711*c*-1 may be disposed to be in contact with the top surface of the second conductive layer 711*b*, and the third conductive layer 711*c* may be disposed to be in contact with the top surface of the second insulating layer 711*c*-1. The first and third conductive layers 711*a* and 711*c* may each include a patch, and the first and second insulating layers 711*a*-1 and 711*b*-1 may each include a prepreg substrate.

According to various embodiments, at least one first substrate layer 713 of the first rigid circuit board 710 may include a plurality of conductive layers and a plurality of insulating layers. The plurality of conductive layers may include first, second, and third conductive layers 713*a*, 713*b*, and 713*c*, and the plurality of insulating layers may include first, second, and third insulating layers 713*a*-1, 713*b*-1, and 713*c*-1. For example, the first insulating layer 713*a*-1 may be disposed to be in contact with the top surface of the third conductive layer 711*c* of the first flexible copper clad laminate 711, the first conductive layer 713*a* may be disposed to be in contact with the top surface of the first insulating layer 713*a*-1, the second insulating layer 713*b*-1 may be disposed to be in contact with the top surface of the first conductive layer 713*a*, the second conductive layer 713*b* may be disposed to be in contact with the top surface of the second insulating layer 713*b*-1, the third insulating layer 713*c*-1 may be disposed to be in contact with the top surface of the second conductive layer 713*b*, and the third insulating layer 713*c* may be disposed on the top surface of the third insulating layer 713*c*-1. According to an embodiment, the first, second, and third insulating layers 713*a*-1, 713*b*-1, and 713*c*-1 may each include a prepreg substrate, and the first, second, and third conductive layers 713*a*, 713*b*, and 713*c* may each include a patch.

According to one embodiment, the patches of the first, second, and third conductive layers 713*a*, 713*b*, and 713*c* are made of a conductive layer, and are coupled to the first antenna 711*b* so as to improve resonance and radiation performance.

According to various embodiments, the second flexible copper clad laminate 712 of the first rigid circuit board 710 disposed on the bottom surface of the core layer 700*a* may include a plurality of conductive layers and a plurality of insulating layers. The plurality of conductive layers may include first, second, and third conductive layers 712*a*, 712*b*, and 712*c*, and the plurality of insulating layers may include first and second insulating layers 712*a*-1 and 712*b*-1. For example, the first conductive layer 712*a* may include a first ground GND, and may be disposed to be in contact with the bottom surface of the core layer 700*a*. The first insulating layer 712*a*-1 may be disposed to be in contact with the bottom surface of the first conductive layer 712*a*, the second conductive layer 712*b* including an RF signal line may be disposed to be in contact with the bottom surface of the first insulating layer 712*a*-1, the second insulating layer 712*b*-1 may be disposed to be in contact with the bottom surface of the second conductive layer 712*b*, and the third conductive layer 712*c* may be disposed to be in contact with the bottom surface of the second insulating layer 712*b*-1. The third conductive layer 712*c* may include a second ground GND.

The second flexible copper clad laminate 712 may be substantially a portion of the flexible circuit board 740 or may be integrally formed with the flexible circuit board 740.

According to various embodiments, at least one second substrate layer 714 of the first rigid circuit board 710 may include a plurality of conductive layers and a plurality of insulating layers. The plurality of conductive layers may include first, second, and third conductive layers 714a, 714b, and 714c, and the plurality of insulating layers may include first, second, and third insulating layers 714a-1, 714b-1, and 714c-1. For example, the first insulating layer 714a-1 may be disposed to be in contact with the bottom surface of the third conductive layer 712c of the second flexible copper clad laminate 712, the first conductive layer 714 may be disposed to be in contact with the bottom surface of the first insulating layer 714a-1, the second insulating layer 714b-1 may be disposed to be in contact with the bottom surface of the first conductive layer 714, the second conductive layer 714 may be disposed to be in contact with the bottom surface of the second insulating layer 714b-1, and the third insulating layer 714c-1 may be disposed to be in contact with the bottom surface of the second conductive layer 714. The first, second, and third conductive layers 714a, 714b, and 714c may each include a signal line (not illustrated), the first, second, and third insulating layers 714a-1, 714b-1, and 714c-1 may each include a prepreg material substrate, and the third conductive layer 714c may include a surface mounting device (SMD). For example, the surface mounting device (e.g., an integrated circuit chip) may be mounted on the third conductive layer 714c.

According to an embodiment, the first, second, and third insulating layers 714a-1, 714b-1, and 714c-1 may each include a prepreg material substrate.

Referring to FIG. 8 again, the flexible copper clad laminate 721 of the second rigid circuit board 720 may include a plurality of conductive layers and a plurality of insulating layers. The plurality of conductive layers may include first, second, and third conductive layers 721a, 721b, and 721c, and the plurality of insulating layers may include first and second insulating layers 721a-1 and 721b-1. For example, the first insulating layer 721a-1 may be disposed to be in contact with the bottom surface of the first conductive layer 721a, the second conductive layer 721b may be disposed to be in contact with the bottom surface of the first insulating layer 721a-1, the second insulating layer 721b-1 may be disposed to be in contact with the bottom surface of the second conductive layer 721b, and the third conductive layer 721c may be disposed to be in contact with the bottom surface of the second insulating layer 721b-1.

The first conductive layer 721a may include a ground GND or a second antenna, the second conductive layer 721b may include a second antenna, and the third conductive layer 721c may include a ground GND or a second antenna. The first and second insulating layers 721a-1 and 721b-1 may each include a prepreg substrate. The second antenna may include a dipole antenna or a dipole pattern.

The first conductive layer 721a may be disposed to correspond to the first conductive layer 712a of the second flexible copper clad laminate 712 of the first rigid circuit board 710, and a first conductive layer 741 including a ground GND of the flexible circuit board 740 may be disposed between the first conductive layer 721a of the flexible copper clad laminate 721 of the second rigid circuit board 720 and the first conductive layer 712a of the second flexible copper clad laminate 712 of the first rigid circuit board 710.

The second conductive layer 721b may correspond to the second conductive layer 712b of the second flexible copper clad laminate 712 of the first rigid circuit board 710, and a second conductive layer 742 including an RF signal line of the flexible circuit board 740 may be disposed between the second conductive layer 721b of the flexible copper clad laminate 721 of the second rigid circuit board 720 and the second conductive layer 712b of the second flexible copper clad laminate 712 of the first rigid circuit board 710.

The third conductive layer 721c may be disposed to correspond to the third conductive layer 712c of the second flexible copper clad laminate 712 of the first rigid circuit board 710, and a third conductive layer 743 including a ground GND of the second flexible circuit board 740 may be disposed between the third conductive layer 721c of the flexible copper clad laminate 721 of the second rigid circuit board 720 and the third conductive layer 712c of the second flexible copper clad laminate 712 of the first rigid circuit board.

The flexible circuit board 740 may be disposed to be bent between the first and second rigid circuit boards 710 and 720. In the flexible circuit board 740, first and third conductive layers 741 and 743 each including a ground GND and a second conductive layer 742 including an RF signal line may be disposed, a first insulating layer 744 may be disposed between the first and second conductive layers 741 and 742, and a second insulating layer 745 may be disposed between the second and third conductive layers 742 and 743. For example, the first conductive layer 741 of the flexible circuit board 740 may be disposed between the first conductive layer 712a of the second flexible copper clad laminate 712 of the first rigid circuit board 710 and the first conductive layer 721a of the flexible copper clad laminate 721 of the second rigid circuit board 720. The third conductive layer 743 of the flexible circuit board 740 may be disposed between the third conductive layer 712c of the second flexible copper clad laminate 712 of the first rigid circuit board 710 and the third conductive layer 721c of the flexible copper clad laminate 721 of the second rigid circuit board 720. The second conductive layer 742 of the second flexible circuit board 740 may be disposed between the second conductive layer 712b of the second flexible copper clad laminate 712 of the first rigid circuit board 710 and the second conductive layer 721b of the flexible copper clad laminate 721 of the second rigid circuit board 720.

According to various embodiments, the first, second, and third conductive layers 741, 742, and 743 of the flexible circuit board 740 may electrically connect the second flexible copper clad laminate 712 of the first rigid circuit board 710 and the flexible copper clad laminate 721 of the second rigid circuit board 720. For example, the flexible copper clad laminate 721 of the second rigid circuit board 720 may be electrically connected to the first, second, and third conductive layers 741, 742, and 743 of the flexible circuit board 740.

According to various embodiments, the first flexible copper clad laminate 711 and the second flexible copper clad laminate 712 may include at least one conductive via 750, which electrically connects the second conductive layer 711b including a first antenna of the first flexible copper clad laminate and the second conductive layer 712b including an RF signal line of the second flexible copper clad laminate to each other. The at least one conductive via 750 may include a via hole. For example, the conductive via 750 may be formed in the first insulating layer 711a-1 of the first flexible copper clad laminate 711, the core layer 700a, and the second insulating layer 712a-1 of the second flexible copper clad laminate 721. The conductive via 750 may be formed by passing through each of the layers in a straight line, and in this state, may electrically connect the first conductive layer 711*b* including the first antenna and the second conductive layer 712*b* including the RF signal line to each other. In this way, a feed signal (e.g., an RF signal) may be provided to the first antenna included in the first conductive layer 711*b* via the conductive via 750.

The bending angle of the flexible circuit board 740 may range from about 30 degrees to about 120 degrees. For example, the bending angle of the flexible circuit board 740 may be about 90 degrees.

Figure 9:
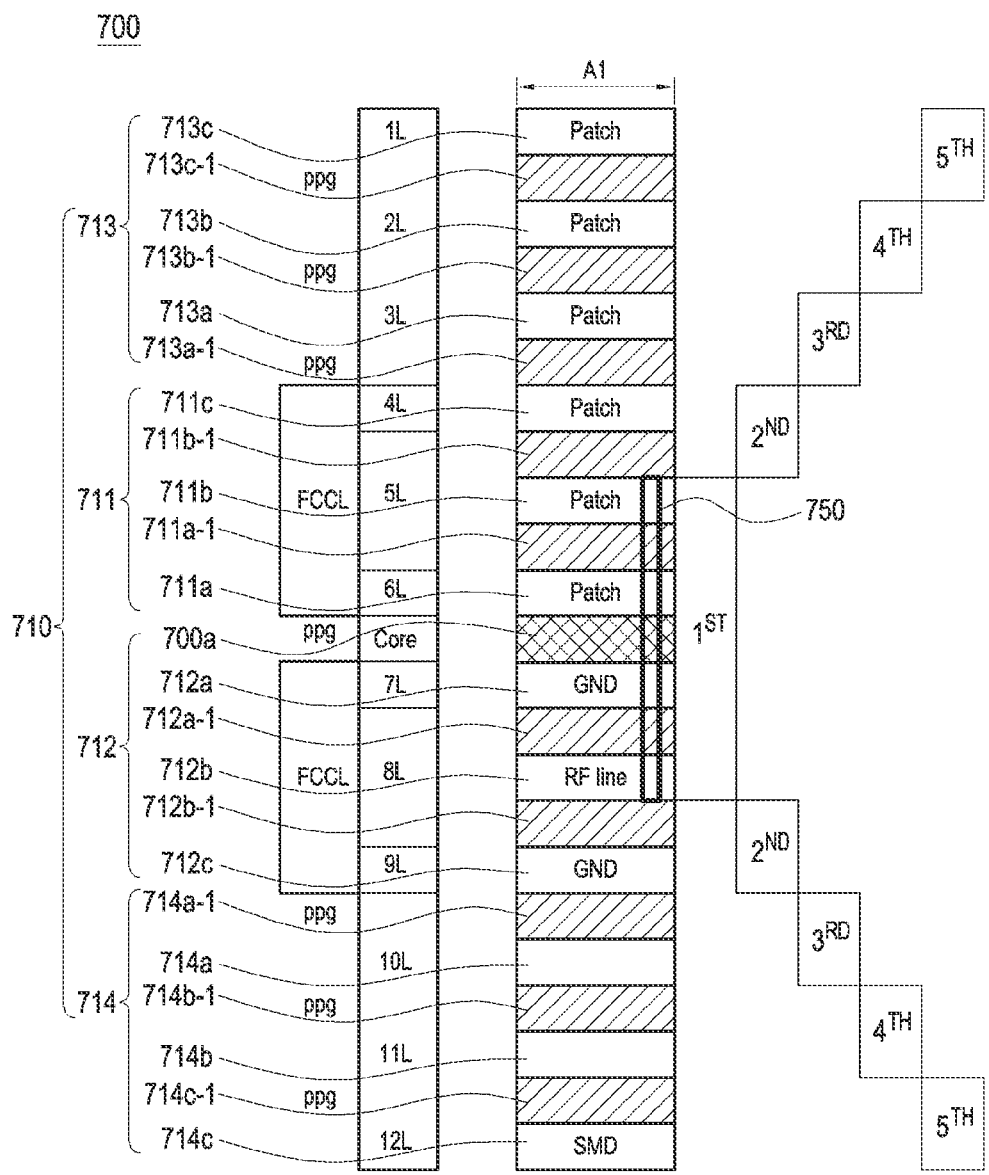
FIG. 9 is a cross-sectional view briefly illustrating a first rigid circuit board in the configuration of the circuit board according to various embodiments of the disclosure.

FIG. 9 is a cross-sectional view briefly illustrating the first rigid circuit board 710 in the configuration of the circuit board 700 according to various embodiments of the disclosure.

Referring to FIG. 9, in the first rigid circuit board 710 disposed in the first area A1 of the rigid-flexible circuit board 700, with reference to the core layer 700*a*, the first flexible copper clad laminate 711 including a plurality of first, second, and third conductive layers 711*a*, 711*b*, and 711*c* and a plurality of first and second insulating layers 711*a*-1 and 711*b*-1 may be disposed on the top surface of the core layer 700*a*. A first substrate layer 713 including a first plurality of first, second, and third conductive layers 713*a*, 713*b*, and 713*c* and a plurality of first, second, and third insulating layers 713*a*-1, 713*b*-1, and 713*c*-1 may be disposed on the top surface of the first flexible copper foil clad laminate 711. With reference to the core layer 700*a*, the second flexible copper clad laminate 712 including first, second, and third conductive layers 712*a*, 712*b*, and 712*c* and first and second insulating layers 712*a*-1 and 712*b*-1 may be disposed on the bottom surface of the core layer 700*a*, and a second substrate layer 714 including first, second, and third conductive layers 714*a*, 714*b*, and 714*c* and first, second, and third insulating layers 714*a*-1, 714*b*-1, and 714*c*-1 may be disposed on the bottom surface of the first flexible copper foil clad laminate 712.

In this way, the first rigid circuit board 710 may be manufactured in 7 layers in a one-step process. For example, a first conductive layer 711*a*, a second conductive layer 711*b* including a first antenna, and a first insulating layer 711*a*-1 may be disposed on the top surface of the core layer 700*a*, and a first conductive layer 712*a* including a ground GND, a second conductive layer 712*b* including an RF signal line, and a first insulating layer 712*a*-1 may be disposed on the bottom surface of the layer 700*a*. For example, in the one-step process described above, three layers including two conductive layers and one insulating layer may be disposed above the core layer, and three layers including two conductive layers and one insulating layer may also be disposed below the core layer.

The first rigid circuit board 710 may be manufactured in two layers in a two-step process. For example, a second insulating layer 711*b*-1 and a third conductive layer 711*c* of the first flexible copper clad laminate 711 may be disposed on the top surface of the second conductive layer 711*b*, and a second insulating layer 721*b*-1 and a third conductive layer 712*c* of the second flexible copper clad laminate 712 may be disposed on the bottom surface of the second conductive layer 712*b*. For example, in the two-step process described above, two layers including one conductive layer and one insulating layer may be disposed on the top surface of the second conductive layer 711*b*, and two layers including one conductive layer and one insulating layer may also be disposed on the bottom surface of the second conductive layer 712*b*.

The first rigid circuit board 710 may be manufactured in two layers in a three-step process. For example, the first insulating layer 713*a*-1 and the first conductive layer 713*a* of the first substrate layer 713 may be disposed on the top surface of the third conductive layer 711*c* of the first flexible copper clad laminate 711, and the first insulating layer 714*a*-1 and the first conductive layer 714*a* of the second substrate layer 714 may be disposed on the bottom surface of the third conductive layer 712*c* of the second flexible copper clad laminate 712. For example, in the three-step process described above, two layers including one conductive layer and one insulating layer may be disposed on the top surface of the third conductive layer 711*c* of the first flexible copper clad laminate 711, and two layers including one conductive layer and one insulating layer may also be disposed on the bottom surface of the third conductive layer 712*c* of the second flexible copper clad laminate 712.

The first rigid circuit board 710 may be manufactured in two layers in a four-step process. For example, the second insulating layer 713*b*-1 and the second conductive layer 713*b* of the first substrate layer 713 may be disposed on the top surface of the first conductive layer 713*a* of the first substrate layer 713, and the second insulating layer 714*b*-1 and the second conductive layer 714*b* of the second substrate layer 714 may also be disposed on the bottom surface of the first conductive layer 714*a* of the second substrate layer 714.

For example, in the four-step process described above, two layers including one conductive layer and one insulating layer may be disposed on the top surface of the first conductive layer 713*a* of the first substrate layer 713, and two layers including one conductive layer and one insulating layer may also be disposed on the bottom surface of the first conductive layer 714*a* of the second substrate layer 714.

The first rigid circuit board 710 may be manufactured in two layers in a five-step process. For example, the third insulating layer 713*c*-1 and the third conductive layer 713*c* of the first substrate layer 713 may be disposed on the top surface of the second conductive layer 713*b* of the first substrate layer 713, and the third insulating layer 714*c*-1 and the third conductive layer 714*c* of the second substrate layer 714 may also be disposed on the bottom surface of the second conductive layer 714*b* of the second substrate layer 714. For example, in the five-step process described above, two layers including one conductive layer and one insulating layer may be disposed on the top surface of the second conductive layer 713*b* of the first substrate layer 713, and two layers including one conductive layer and one insulating layer may also be disposed on the bottom surface of the second conductive layer 714*b* of the second substrate layer 714.

In this way, the first rigid circuit board 710 may be manufactured by disposing the plurality of conductive layers and the plurality of insulating layers above and below the core layer 700*a* to be symmetrical and identical to each other. Here, the number of conductive layers and insulating layers of the first rigid circuit board 710 is not limited thereto. For example, when the plurality of conductive layers and the plurality of insulating layers are symmetrically and identically disposed above and below the core layer 700*a*, the number of conductive layers and insulating layers may be at least two or three or more.

In this way, in the first rigid circuit board 710 (e.g., 720 in FIG. 8), with reference to the core layer 700*a*, by disposing a plurality of conductive layers and a plurality of insulating layers above and below the core layer 700*a* to be symmetrical and identical to each other, the plurality of conductive layers and the plurality of insulating layers of the first rigid circuit board 710 can be evenly laminated, whereby, even when a high-speed signal line (e.g., an RF signal line) is laid on the first rigid circuit board 710, it is possible to reduce signal loss due to a change in impedance of the high-speed signal line and it is also possible to manufacture the first rigid circuit board 710, which has been manufactured through a conventional seven-step process, through a five-step process. Thus, it is possible to reduce manufacturing processes and manufacturing time of a product.

According to various embodiments, the core layer 700a may be made of a prepreg substrate. The prepreg material may be a material obtained by impregnating a glass fabric or a glass mat with a catalyst-applied unsaturated polyester resin and gelling the resin.

In addition, the plurality of insulating layers may be formed of a board made of the prepreg material. For example, at least some of the plurality of insulating layers may be formed in multiple layers by repeating a method of coating an adhesive material and then compressing an insulating layer, such as a prepreg, and a thin copper plate.

According to various embodiments, the first and second rigid circuit boards (e.g., 710 and 720 in FIG. 8) and the flexible circuit board (e.g., 740 in FIG. 8) may be manufactured as a laminate plate in which a metal thin plate (e.g., copper (Cu)) is laminated on at least one surface of a polypropylene glycol (PPG)- or polyimide (PI)-based substrate layer, lie the flexible copper clad laminate (FCCL). As another example, a thin metal plate may be laminated on the top surface or the bottom surface of a polypropylene glycol (PPG)- or polyimide (PI)-based substrate layer, and a plated copper foil may be laminated thereon. As another example, an ink layer may be laminated to be coated on the top surface of the plated copper foil circuit, thereby protecting the circuit.

According to various embodiments, the polyimide may be a highly heat-resistant resin prepared through solution polymerization of an aromatic dianhydride and an aromatic diamine or an aromatic diisocyanate to prepare a polyamic acid derivative, and then causing ring closure dehydration and imidization of the polyamic acid derivative at a high temperature. Accordingly, such a polyimide resin is an insoluble and infusible ultra-high heat-resistant resin and may be excellent in thermal oxidation resistance, heat resistance, radiation resistance, low-temperature characteristic, or chemical resistance.

Figure 10A:
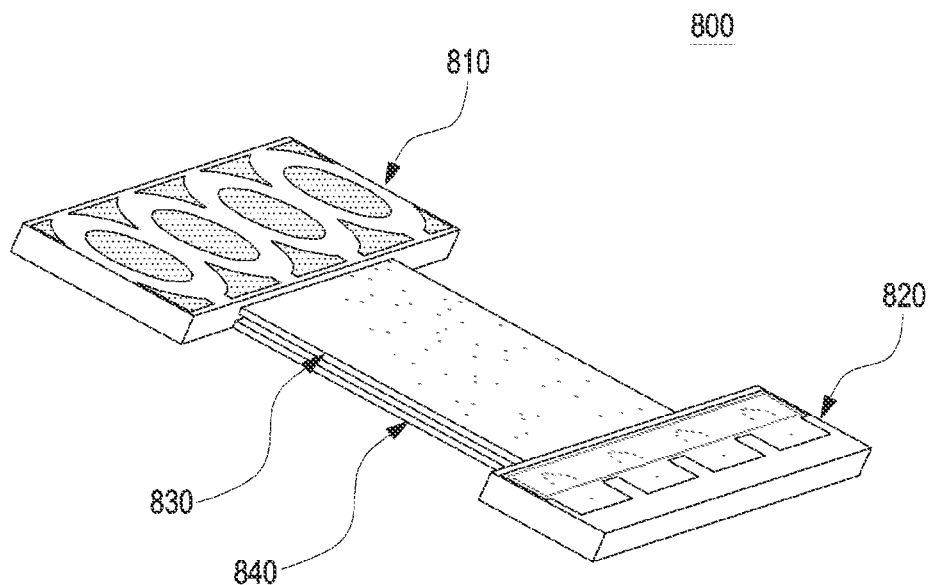
FIG. 10A is a perspective view illustrating first and second rigid circuit boards and first and second flexible circuit boards in the configuration of a circuit board according to various other embodiments of the disclosure in an assembled state.
Figure 10B:
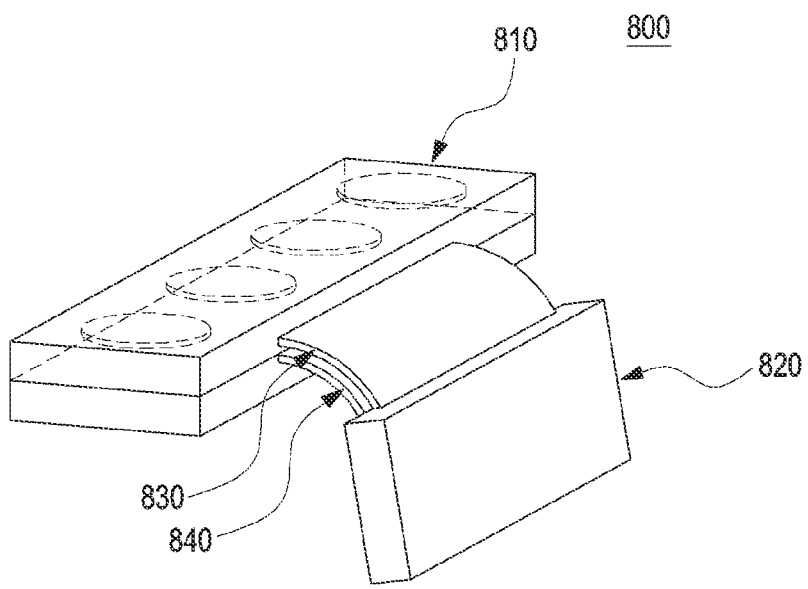
FIG. 10B is a perspective view illustrating first and second rigid circuit boards and first and second flexible circuit boards, which are bent, in the configuration of a circuit board according to various other embodiments of the disclosure in an assembled state.

FIG. 10A is a perspective view illustrating first and second rigid circuit boards and first and second flexible circuit boards in the configuration of a circuit board according to various other embodiments of the disclosure in an assembled state. FIG. 10B is a perspective view illustrating first and second rigid circuit boards and first and second flexible circuit boards, which are bent, in the configuration of a circuit board according to various other embodiments of the disclosure in an assembled state, and FIG. 11 is a view briefly illustrating first and second rigid circuit boards and first and second flexible circuit boards in the configuration of a circuit board according to various embodiments of the disclosure in an assembled state.

Figure 11:
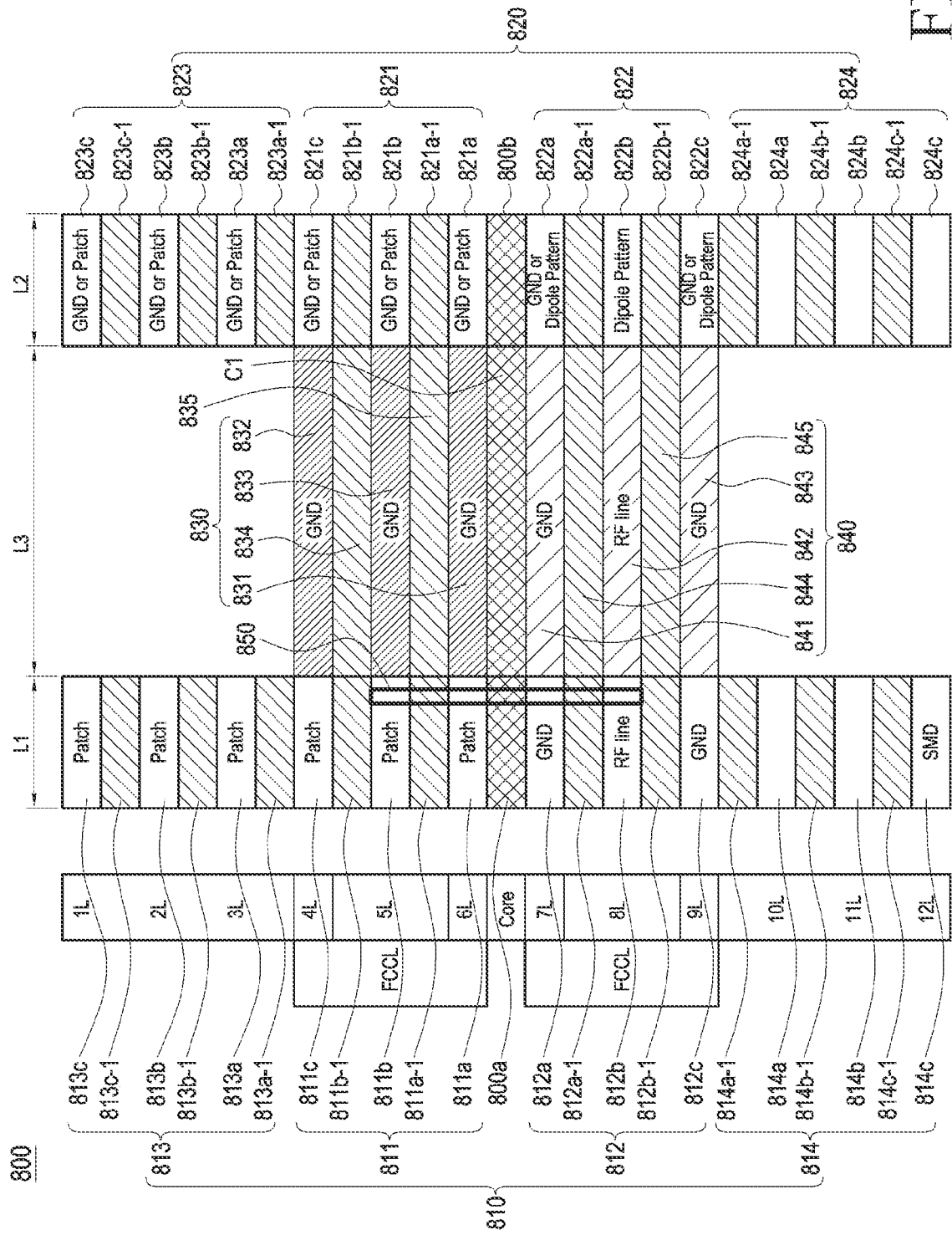
FIG. 11 is a view briefly illustrating first and second rigid circuit boards and first and second flexible circuit boards in the configuration of a circuit board according to various embodiments of the disclosure in an assembled state.

Referring to FIGS. 10A, 10B, and 11, according to various embodiments, a circuit board 800 may include first and second rigid circuit boards 810 and 820 and first and second flexible circuit boards 830 and 840 disposed between the first and second rigid circuit boards 810 and 820. According to an embodiment, an empty space C1 may be formed such that the first and second flexible circuit boards 830 and 840 can be spaced apart from each other. For example, the first rigid circuit board 810 may be disposed in a first area L1 of the circuit board 800, the first and second flexible circuit board 830 and 840 may be disposed in a third area L3 of the circuit board 800 (e.g., rigid-flexible circuit board), and the second rigid circuit board 820 may be disposed in a second area L2 of the circuit board 800.

According to various embodiments, the first and second flexible circuit boards 830 and 840 extend to at least a portion of the first and second flexible copper clad laminate to be described later, and may be exposed between the first and second rigid circuit boards 810 and 820 such that at least portion of the first and second flexible circuit boards 830 and 840 are partially bent.

According to various embodiments, the circuit board 800 may have a multilayer structure, the first rigid circuit board 810 may include a first core layer 800a including a top surface and a bottom surface and may include a first flexible copper clad laminate 811 laminated on the top surface of the first core layer 800a, a second flexible copper clad laminate 812 laminated on the bottom surface of the first core layer 800a, at least one first substrate layer 813 laminated on the top surface of the first flexible copper clad laminate 811, and at least one second substrate layer 814 laminated on the bottom surface of the second flexible copper clad laminate 812.

According to various embodiments, the first flexible copper clad laminate 811 of the first rigid circuit board 810 may include a plurality of conductive layers and a plurality of insulating layers. The plurality of conductive layers may include first, second, and third conductive layers 811a, 811b, and 811c, and the plurality of insulating layers may include first and second insulating layers 811a-1 and 811b-1. For example, the first conductive layer 811a may be disposed to be in contact with the top surface of the first core layer 800a, the first insulating layer 811a-1 may be disposed to be in contact with the top surface of the first conductive layer 811a, the second conductive layer 811b including a first antenna (e.g., a patch antenna) may be disposed to be in contact with the top surface of the first insulating layer 811a-1, the second insulating layer 811b-1 may be disposed to be in contact with the top surface of the second conductive layer 811b, and the third conductive layer 811c may be disposed to be in contact with the top surface of the second insulating layer 811b-1. The first and third conductive layers 811a and 811c may each include a patch, the second conductive layer may include the first antenna, and the first and second insulating layers 811a-1 and 811b-1 may each include a prepreg substrate.

According to various embodiments, at least one first substrate layer 813 of the first rigid circuit board 810 may include a plurality of conductive layers and a plurality of insulating layers. The plurality of conductive layers may include first, second, and third conductive layers 813a, 813b, and 813c, and the plurality of insulating layers may include first, second, and third insulating layers 813a-1, 813b-1, and 813c-1. For example, the first insulating layer 813a-1 may be disposed to be in contact with the top surface of the third conductive layer 811c of the first flexible copper clad laminate 811, the first conductive layer 813a may be disposed to be in contact with the top surface of the first insulating layer 813a-1, the second insulating layer 813b-1 may be disposed to be in contact with the top surface of the first conductive layer 813a, the second conductive layer 813b may be disposed to be in contact with the top surface of the second insulating layer 813b-1, the third insulating layer 813c-1 may be disposed to be in contact with the top surface of the second conductive layer 813*b*, and the third conductive layer 813*c* may be disposed on the top surface of the third insulating layer 813*c*-1. According to an embodiment, the first, second, and third insulating layers 813*a*-1, 813*b*-1, and 813*c*-1 may each include a prepreg substrate, and the first, second, and third conductive layers 813*a*, 813*b*, and 813*c* may each include a patch.

The patch may be coupled to the first antenna so as to improve resonance and radiation performance.

According to various embodiments, the second flexible copper clad laminate 812 of the first rigid circuit board 810 disposed on the bottom surface of the first core layer 800*a* may include a plurality of conductive layers and a plurality of insulating layers. The plurality of conductive layers may include first, second, and third conductive layers 812*a*, 812*b*, and 812*c*, and the plurality of insulating layers may include first and second insulating layers 812*a*-1 and 812*b*-1. For example, the first conductive layer 812*a* may include a first ground GND, and may be disposed to be in contact with the bottom surface of the first core layer 800*a*. The first insulating layer 812*a*-1 may be disposed to be in contact with the bottom surface of the first conductive layer 812*a*, the second conductive layer 812*b* including an RF signal line may be disposed to be in contact with the bottom surface of the first insulating layer 812*a*-1, the second insulating layer 812*b*-1 may be disposed to be in contact with the bottom surface of the second conductive layer 812*b*, and the third conductive layer 812*c* may be disposed to be in contact with the bottom surface of the second insulating layer 812*b*-1. The third conductive layer 812*c* may include a second ground GND.

According to various embodiments, at least one second substrate layer 814 of the first rigid circuit board 810 may include a plurality of conductive layers and a plurality of insulating layers. The plurality of conductive layers may include first, second, and third conductive layers 814*a*, 814*b*, and 841*c*, and the plurality of insulating layers may include first, second, and third insulating layers 814*a*-1., 814*b*-1, and 814*c*-1. For example, the first insulating layer 814*a*-1 may be disposed to be in contact with the bottom surface of the third conductive layer 812*c* of the second flexible copper clad laminate 812, the first conductive layer 814*a* may be disposed to be in contact with the bottom surface of the first insulating layer 814*a*-1, the second insulating layer 814*b*-1 may be disposed to be in contact with the bottom surface of the first conductive layer 814*a*, the second conductive layer 814*b* may be disposed to be in contact with the bottom surface of the second insulating layer 814*b*-1, the third insulating layer 814*c*-1 may be disposed to be in contact with the bottom surface of the second conductive layer 814*b*, and the third conductive layer 814*c* may be disposed to be in contact with the bottom surface of the third insulating layer 814*c*-1.

The first, second, and third conductive layers 814*a*, 814*b*, and 814*c* may each include a signal line (not illustrated), the first and second insulating layers 814*a*-1 and 814*b*-1 may each include a prepreg material substrate, and the third conductive layer 814*c* may include a surface mounting device (SMD) (not illustrated). For example, the surface mounting device (e.g., an integrated circuit chip) may be mounted on the third conductive layer 814*c*.

Referring to FIG. 11 again, the second rigid circuit board 820 may include a second core layer 800*b* including a top surface and a bottom surface, and may include a third flexible layer clad laminate 821 laminated on the top surface of the second core layer 800*b*, and a fourth flexible copper clad laminate 822 laminated on the bottom surface of the second core layer 800*b*. At least one third substrate layer 823 laminated on the top surface of the third flexible copper clad laminate 821 may be included, and at least one fourth layer 824 laminated on the bottom surface of the fourth flexible copper clad laminate 822 may be included.

According to various embodiments, the third flexible copper clad laminate 821 of the second rigid circuit board 820 may include a plurality of conductive layers and a plurality of insulating layers. The plurality of conductive layers may include first, second, and third conductive layers 821*a*, 821*b*, and 821*c*, and the plurality of insulating layers may include first and second insulating layers 821*a*-1 and 821*b*-1. For example, the first conductive layer 821*a* may be disposed to be in contact with the top surface of the second core layer 800*b*, the first insulating layer 821*a*-1 may be disposed to be in contact with the top surface of the first conductive layer 821*a*, the second conductive layer 821*b* may be disposed to be in contact with the top surface of the first insulating layer 821*a*-1, the second insulating layer 821*b*-1 may be disposed to be in contact with the top surface of the second conductive layer 821*b*, and the third conductive layer 821*c* may be disposed to be in contact with the top surface of the second insulating layer 821*b*-1. The first conductive layer 821*a* may be disposed to correspond to the first conductive layer 811*a* of the first flexible copper clad laminate 811 of the first rigid circuit board 810. The first conductive layer 831 of the first flexible circuit board 830 may be disposed between the first conductive layer 821*a* of the third flexible copper clad laminate 821 of the second rigid circuit board 820 and the first conductive layer 811*a* of the first flexible copper clad laminate 811 of the first rigid circuit board 810. The third conductive layer 821*c* may be disposed to correspond to the third conductive layer 811*c* of the first flexible copper clad laminate 811 of the first rigid circuit board 810, and the second conductive layer 832 of the first flexible circuit board 830 may be disposed between the third conductive layer 821*c* of the third flexible copper clad laminate 821 of the second rigid circuit board 820 and the third conductive layer 811*c* of the first flexible copper clad laminate 811 of the first rigid circuit board 810. First and second insulating layers 834 and 835 may be disposed between the first, second, and third conductive layers 831, 832, and 833 of the first flexible circuit board 830. The third flexible copper clad laminate 821 may be substantially a portion of the first flexible circuit board 830 or may be integrally formed with the first flexible circuit board 830.

According to various embodiments, at least one third substrate layer 823 of the second rigid circuit board 820 may include a plurality of conductive layers and a plurality of insulating layers. The plurality of conductive layers may include first, second, and third conductive layers 823*a*, 823*b*, and 823*c*, and the plurality of insulating layers may include a plurality of first, second, and third insulating layers 823*a*-1, 823*b*-1, and 823*c*-1. For example, the first insulating layer 823*a*-1 may be disposed on the top surface of the third conductive layer 821*c* of the first flexible copper clad laminate 821. The first conductive layer 823*a* may be disposed to be in contact with the top surface of the first insulating layer 823*a*-1, and the second insulating layer 823*b*-1 may be disposed to be in contact with the top surface of the first conductive layer 823*a*. The second conductive layer 823*b* may be disposed to be in contact with the top surface of the second insulating layer 823*b*-1, the third insulating layer 823*c*-1 may be disposed to be in contact with the top surface of the second conductive layer 823*b*, and the third conductive layer 823*c* may be disposed to be in contact with the top surface of the third insulating layer 823*c*-1. The first, second, and third conductive layers 823*a*, 823b, and 823c may each include a ground GND or a patch, and the first, second, and third insulating layers 823a-1, 823b-1, and 823c-1 may each include a prepreg substrate.

According to various embodiments, the fourth flexible copper clad laminate 822 of the second rigid circuit board 820 disposed on the bottom surface of the second core layer 800b may include a plurality of conductive layers and a plurality of insulating layers. The plurality of conductive layers may include the first, second, and third conductive layers 822a, 822b, and 822c, and the plurality of insulating layers may include the first and second insulating layers 822a-1 and 822b-1. For example, the first conductive layer 822a may be disposed on the bottom surface of the second core layer 800b, and the first conductive layer 822a may include a ground GND or a first antenna. The first insulating layer 822a-1 may be disposed to be in contact with the bottom surface of the first conductive layer 822a, and the second conductive layer 822b including a second antenna may be disposed to be contact with the bottom surface of the first insulating layer 822a-1. The bottom surface of the second conductive layer 822b may be disposed to be in contact with the second insulating layer 822b-1, and the third conductive layer 822c including a ground GND or a third antenna may be disposed to be contact with the bottom surface of the second insulating layer 822a-1. The fourth flexible copper clad laminate 822 may be substantially a portion of the second flexible circuit board 840 or may be integrally formed with the second flexible circuit board 840.

The first, second, and third antennas of the first, second, and third conductive layers 822a, 822b, and 822c may each include a dipole antenna or a dipole pattern.

The first conductive layer 822a may be disposed to correspond to the first conductive layer 812a of the second flexible copper clad laminate 812 of the first rigid circuit board 810. The first conductive layer 841 of the second flexible circuit board 840 may be disposed between the first conductive layer 822a of the fourth flexible copper clad laminate 822 of the second rigid circuit board 820 and the first conductive layer 812a of the second flexible copper clad laminate 812 of the first rigid circuit board 810. The second conductive layer 822b may correspond to the second conductive layer 812b of the second flexible copper clad laminate 812 of the first rigid circuit board 810. The second conductive layer 842 of the second flexible circuit board 840 may be disposed between the second conductive layer 822b of the fourth flexible copper clad laminate 822 of the second rigid circuit board 820 and the second conductive layer 812b of the second flexible copper clad laminate 812 of the first rigid circuit board 810. The third conductive layer 822c may be disposed to correspond to the third conductive layer 812c of the second flexible copper clad laminate 812 of the first rigid circuit board 810. The third conductive layer 843 of the second flexible circuit board 840 may be disposed between the third conductive layer 822c of the fourth flexible copper clad laminate 822 of the second rigid circuit board 820 and the third conductive layer 812c of the second flexible copper clad laminate 812 of the first rigid circuit board. A first insulating layer 844 may be disposed between the first and second conductive layers 841 and 842 of the second flexible circuit board 840, and a second insulating layer 845 may be disposed between the second and third conductive layers 842 and 843 of the second flexible circuit board 840.

According to various embodiments, at least one fourth substrate layer 824 of the second rigid circuit board 820 may include a plurality of conductive layers and a plurality of insulating layers. The plurality of conductive layers may include first, second, and third conductive layers 824a, 824b, and 824c, and the plurality of insulating layers may include first, second, and third insulating layers 824a-1, 824b-1, and 824c-1. For example, the first insulating layer 824a-1 may be disposed on the bottom surface of the third conductive layer 822c of the second flexible copper clad laminate 822, the first conductive layer 824a may be disposed on the bottom surface of the first insulating layer 824a-1, the second insulating layer 824b-1 may be disposed on the bottom surface of the first conductive layer 824a, the second conductive layer 824b may be disposed on the bottom surface of the second insulating layer 824b-1, the third insulating layer 824c-1 may be disposed on the bottom surface of the second conductive layer 824b, and the third conductive layer 824c may be disposed on the bottom surface of the third insulating layer 824c-1.

According to various embodiments, the first flexible circuit board 830 may be disposed to be exposed between the first and second rigid circuit boards 810 and 820 so that at least a portion of the first flexible circuit board 830 can be bent. The first flexible circuit board 830 may include a plurality of conductive layers and a plurality of insulating layers, and the plurality of conductive layers may include first, second, and third conductive layers 831, 832, and 833, each of which includes a ground GND. The first conductive layer 831 may be disposed between the first conductive layer 811a of the first flexible copper clad laminate 811 of the first rigid circuit board 810 and the first conductive layer 821a of the first flexible copper clad laminate 821 of the second rigid circuit board 820. The second conductive layer 832 may be disposed between the third conductive layer 821c of the first flexible copper clad laminate 811 of the first rigid circuit board 810 and the third conductive layer 821c of the first flexible copper clad laminate 821 of the second rigid circuit board 820. The third conductive layer 833 may be disposed between the second conductive layer 811b of the first flexible copper clad laminate 811 of the first rigid circuit board 810 and the second conductive layer 821b of the first flexible copper clad laminate 821 of the second rigid circuit board 820. The first insulating layer 834 may be disposed between the first and third conductive layers 831 and 833, and the second insulating layer 835 may be disposed between the second and third conductive layers 832 and 833. For example, the first conductive layer 831 may electrically connect the first conductive layer 811a of the first flexible copper clad laminate 811 of the first rigid circuit board 810 and the first conductive layer 821a of the first flexible copper clad laminate 821 of the second rigid circuit board 820 to each other. The second conductive layer 832 may electrically connect the third conductive layer 811c of the first flexible copper clad laminate 811 of the first rigid circuit board 810 and the third conductive layer 821c of the first flexible copper clad laminate 821 of the second rigid circuit board 820 to each other. The third conductive layer 833 may electrically connect the second conductive layer 811b of the first flexible copper clad laminate 811 of the first rigid circuit board 810 and the second conductive layer 821b of the first flexible copper clad laminate 821 of the second rigid circuit board 820 to each other.

The second flexible circuit board 840 may be disposed to be spaced apart from the first flexible circuit board 830, and an empty space C1 may be formed between the first and second flexible circuit boards so that the first and second flexible circuit boards are spaced apart from each other. The second flexible circuit board 840 may be disposed to be exposed between the first and second rigid circuit boards 810 and 820 so that at least a portion of the first flexible circuit board 830 can be bent. In the second flexible circuit board 840, first and third conductive layers 841 and 843, each of which includes a ground GND, and a second conductive layer 842 including an RF signal line may be disposed. For example, the first conductive layer 841 of the second flexible circuit board 840 may be disposed between the first conductive layer 812a of the second flexible copper clad laminate 812 of the first rigid circuit board 810 and the first conductive layer 822a of the fourth flexible copper clad laminate 822 of the second rigid circuit board 820. The third conductive layer 843 of the second flexible circuit board 840 may be disposed between the third conductive layer 812c of the second flexible copper clad laminate 812 of the first rigid circuit board 810 and the third conductive layer 822c of the fourth flexible copper clad laminate 822 of the second rigid circuit board 820. The second conductive layer 842 of the second flexible circuit board 840 may be disposed between the second conductive layer 812b of the second flexible copper clad laminate 812 of the first rigid circuit board 810 and the second conductive layer 822b of the fourth flexible copper clad laminate 822 of the second rigid circuit board 820. The first insulating layer 844 may be disposed between the first and second conductive layers 841 and 842, and the second insulating layer 845 may be disposed between the second and third conductive layers 842 and 843. For example, the first conductive layer 841 of the second flexible circuit board 840 may be electrically connect the first conductive layer 812a of the second flexible copper clad laminate 812 of the first rigid circuit board 810 and the first conductive layer 822a of the fourth flexible copper clad laminate 822 of the second rigid circuit board 820 to each other. The third conductive layer 843 of the second flexible circuit board 840 may electrically connect the third conductive layer 812c of the second flexible copper clad laminate 812 of the first rigid circuit board 810 and the third conductive layer 822c of the fourth flexible copper clad laminate 822 of the second rigid circuit board 820 to each other. The second conductive layer 842 of the second flexible circuit board 840 may electrically connect the second conductive layer 812b of the second flexible copper clad laminate 812 of the first rigid circuit board 810 and the second conductive layer 822b of the fourth flexible copper clad laminate 822 of the second rigid circuit board 820 to each other.

According to various embodiments, the first flexible copper clad laminate 811 and the second flexible copper clad laminate 812 may include at least one conductive via 850, which electrically connects the second conductive layer 811b including a first antenna of the first flexible copper clad laminate and the second conductive layer 812b including an RF signal line of the second flexible copper clad laminate to each other. The at least one conductive via 850 may include a via hole. For example, the conductive via may be formed in the first insulating layer 811a-1 of the first flexible copper clad laminate 811, the first core layer 800a, and the second insulating layer 812a-1 of the second flexible copper clad laminate 812. The conductive via 850 may be formed by passing through each of the layers in a straight line, and in this state, may electrically connect the first conductive layer 811b including the first antenna and the second conductive layer 812b including the RF signal line to each other. As such, the conductive vias 850 formed in respective layers are electrically connected to each other so as to conduct current.

The bending angles of the first and second flexible circuit boards 830 and 840 may range from about 30 degrees to about 120 degrees. For example, the bending angles of the first and second flexible circuit boards 830 and 840 may be about 90 degrees.

At least one of the components of the first rigid circuit board 810 may be the same as or similar to at least one of the components of the components of the first rigid circuit board 710 of FIG. 9, and redundant descriptions will be omitted below.

According to various embodiments of the disclosure, a circuit board (e.g., 700 in FIG. 8) may include: a core layer (e.g., 700a in FIG. 8) including a top surface and a bottom surface, and formed of as a prepreg substrate; a first flexible copper clad laminate (e.g., 711 in FIG. 8) including a plurality of conductive layers and laminated on the top surface; one or more first substrate layers (e.g., 713 in FIG. 8) laminated above the first flexible copper clad laminate, and including a plurality of conductive layers formed on the prepreg substrate; a second flexible copper clad laminate (e.g., 712 in FIG. 8) including a plurality of conductive layers and laminated on the bottom surface; and one or more second substrate layers (e.g., 714 in FIG. 8) laminated below the second flexible copper clad laminate, and including a plurality of conductive layers formed in the prepreg substrate.

According to various embodiments of the disclosure, at least one antenna may be disposed on at least some of the plurality of conductive layers of the first flexible copper clad laminate.

According to various embodiments of the disclosure, at least one patch may be disposed on at least some of the plurality of conductive layers of the first flexible copper clad laminate.

According to various embodiments of the disclosure, a patch may be disposed on at least some of the conductive layers of the one or more first substrate layers.

According to various embodiments of the disclosure, a signal line may be disposed on at least some of the plurality of conductive layers of the second flexible copper clad laminate.

According to various embodiments of the disclosure, a ground may be disposed on at least some of the plurality of conductive layers of the second flexible copper clad laminate.

According to various embodiments, among the one or more second substrate layers, at least one layer disposed on the outer surface of the circuit board may include a surface mounting device (SMD). For example, the surface mounting device (e.g., an integrated circuit chip) may be mounted on the at least one layer (e.g., the third insulating layer 814c-1).

According to various embodiments, the number of first substrate layers disposed above the core layer and the number of second substrate layers disposed below the core layer are equal to each other.

According to various embodiments, the circuit board may further include at least one conductive via (e.g., 750 in FIG. 8) configured to electrically connect the at least one antenna and the signal line to each other.

According to various embodiments of the disclosure, at least a portion of the first and second flexible copper clad laminates may extend from the core layer and the one or more first and second substrate layers to be exposed to the outside.

According to various embodiments of the disclosure, another circuit board may be disposed in the at least a portion of the first and second flexible copper clad laminates and may be electrically connected to the circuit board using the plurality of conductive layers of the first and second flexible copper clad laminates.

According to various embodiments of the disclosure, the another circuit board may include: another core layer disposed between at least a portion of the first copper clad laminate and at least a portion of the second flexible copper clad laminate; one or more third substrate layers laminated above the at least a portion of the first flexible copper clad laminate; and one or more fourth substrate layers laminated below the at least a portion of the second flexible copper clad laminate.

According to various embodiments of the disclosure, a circuit board may include: a core layer including a top surface and a bottom surface, and formed of a hard substrate; a first flexible copper clad laminate including a plurality of first conductive layers and laminated on the top surface; and a second flexible copper clad laminate including a plurality of conductive layers and laminated on the bottom surface.

According to various embodiments, the number of substrate layers are disposed above the first flexible copper clad laminate and the number of substrate layers disposed below the second flexible copper clad laminate may be equal to each other.

According to various embodiments of the disclosure, at least one antenna may be disposed on at least some of the plurality of first conductive layers.

According to an embodiment of the disclosure, an electronic device may include: a first rigid circuit board (e.g., 710 in FIG. 8) including a core layer (e.g., 700a in FIG. 7) including a top surface and a bottom surface, one or more first substrate layers disposed above the top surface of the core layer, and one or more second substrate layers disposed below the bottom surface of the core layer, wherein a first flexible copper clad laminate is disposed between the core layer and the one or more first substrate layers and a second flexible copper clad laminate is disposed between the core layer and the one or more second substrate layers; a second rigid circuit board (e.g., 720 in FIG. 8) disposed on at least a portion of the second flexible copper clad laminate and electrically connected to the first rigid circuit board using the plurality of conductive layers of the second flexible copper clad laminate; and a flexible circuit board (e.g., 740 in FIG. 8) extending from at least a portion of the second flexible copper clad laminate and exposed between the first and second rigid circuit boards such that at least a portion of the flexible circuit board is bent.

According to various embodiments of the disclosure, at least a portion of the first flexible copper clad laminate and the second flexible copper clad laminate may be exposed between the first rigid circuit board and the second rigid circuit board, and at least a portion of the first and second flexible copper clad laminates may be bent such that that the first and second rigid circuit boards are not horizontal.

According to various embodiments of the disclosure, an electronic device may include: a first rigid circuit board (e.g., 810 in FIG. 11) including: a first core layer (e.g., 800a in FIG. 11A) including a top surface and a bottom surface; one or more first substrate layers (e.g., 813 in FIG. 11) disposed above the top surface of the first core layer; and one or more second substrate layers (814 in FIG. 11) disposed below the bottom surface of the first core layer, wherein a first flexible copper clad laminate (e.g., 811 in FIG. 11) is disposed between the first core layer and the one or more first substrate layers and a second flexible copper clad laminate (e.g., 812 in FIG. 11) is disposed between the first core layer and the one or more second substrate layers; a second rigid circuit board including: a second core layer (e.g., 800b in FIG. 11) disposed on at least a portion of the first and second flexible copper clad laminates and including a top surface and a bottom surface; one or more third substrate layers (e.g., 823 in FIG. 11) disposed above the top surface of the second core layer; and one or more fourth substrate layers (e.g., 824 in FIG. 11) disposed below the bottom surface of the second core layer, wherein a third flexible copper clad laminate (e.g., 821 in FIG. 11) is disposed between the second core layer and the one or more third substrate layers and a fourth flexible copper clad laminate (e.g., 822 in FIG. 11) is disposed between the second core layer and the one or more fourth substrate layers; and first and second flexible circuit boards (e.g., 840 and 850 in FIG. 11) extending from at least a portion of the first and second flexible copper clad laminates and exposed between the first and second rigid circuit boards such that at least a portion of the first and second flexible circuit boards is bent.

As will be apparent to a person ordinarily skilled in the technical field to which the disclosure belongs, a circuit board according to various embodiments of the disclosure and an electronic device including the same are not limited by the above-described embodiments and drawings, and may be variously substituted, modified, and changed within the technical scope of the disclosure.

The invention claimed is:
1. A circuit board comprising:
 a core layer comprising a top surface and a bottom surface, and formed of a prepreg substrate;
 a first flexible copper clad laminate comprising a plurality of conductive layers and laminated on the top surface;
 at least one first substrate layer laminated above the first flexible copper clad laminate, and comprising a plurality of conductive layers formed on the prepreg substrate;
 a second flexible copper clad laminate comprising a plurality of conductive layers and laminated on the bottom surface; and
 at least one second substrate layer laminated below the second flexible copper clad laminate, and comprising a plurality of conductive layers formed in the prepreg substrate,
 wherein at least one antenna is disposed on at least some of the plurality of conductive layers of the first flexible copper clad laminate, and
 at least one patch is disposed on at least some of the plurality of conductive layers of the first flexible copper clad laminate.

2. The circuit board of claim 1, wherein a patch is disposed on at least some of the conductive layers of the at least one first substrate layer.

3. The circuit board of claim 1, wherein a signal line is disposed on at least some of the plurality of conductive layers of the second flexible copper clad laminate,
 a ground is disposed on at least some other conductive layers of the second flexible copper clad laminate, and
 the circuit board further comprises at least one conductive via configured to electrically connect the at least one antenna and the signal line to each other.

4. The circuit board of claim 1, wherein, among the at least one second substrate layer, at least one layer disposed on an outer surface of the circuit board comprises a surface mounting device (SMD).

5. The circuit board of claim 1, wherein a number of first substrate layers disposed above the core layer and a number of second substrates disposed below the core layer are equal to each other.

6. The circuit board of claim 1, wherein at least a portion of the first and second flexible copper clad laminates includes the core layer and a flexible circuit board exposed to an outside of the at least one first and second substrate, and wherein another circuit board is disposed in the at least a portion of the first and second flexible copper clad laminates and is electrically connected to the circuit board using the plurality of conductive layers of the first and second flexible copper clad laminates.

7. The circuit board of claim 6, wherein the another circuit board comprises:

another core layer disposed between at least a portion of the first copper clad laminate and at least a portion of the second flexible copper clad laminate;

at least one third substrate layer laminated above the at least a portion of the first flexible copper clad laminate; and at least one fourth substrate layer laminated below the at least a portion of the second flexible copper clad laminate.

8. The circuit board of claim 1, further comprising:

a first rigid circuit board comprising: a first core layer comprising a top surface and a bottom surface; at least one first substrate layer disposed above the top surface of the first core layer; and at least one second substrate layer disposed below the bottom surface of the first core layer, wherein a first flexible copper clad laminate is disposed between the first core layer and the at least one first substrate layer and a second flexible copper clad laminate is disposed between the first core layer and the at least one second substrate layer;

a second rigid circuit board comprising: a second core layer disposed on at least a portion of the first and second flexible copper clad laminates and comprising a top surface and a bottom surface; at least one third substrate layer disposed above the top surface of the second core layer;

and at least one fourth substrate layer disposed below the bottom surface of the second core layer, wherein a third flexible copper clad laminate is disposed between the second core layer and the at least one third substrate layer and a fourth flexible copper clad laminate is disposed between the second core layer and the at least one fourth substrate layer; and first and second flexible circuit boards extending from at least a portion of the first and second flexible copper clad laminates and exposed between the first and second rigid circuit boards such that at least a portion of the first and second flexible circuit boards is bent.

\* \* \* \* \*